US012685064B2

(12) United States Patent
Nasman

(10) Patent No.: US 12,685,064 B2
(45) Date of Patent: Jul. 14, 2026

(54) WET PROCESSING SYSTEM AND NOZZLE FOR DISPENSING A LIQUID LATERALLY ACROSS A SEMICONDUCTOR WAFER

(71) Applicant: Tokyo Electron Limited, Tokyo (JP)

(72) Inventor: Ronald Nasman, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 232 days.

(21) Appl. No.: 18/436,920

(22) Filed: Feb. 8, 2024

(65) Prior Publication Data

US 2025/0259863 A1     Aug. 14, 2025

(51) Int. Cl.
*H10P 70/00* (2026.01)
*H10P 72/00* (2026.01)
*H10P 72/10* (2026.01)

(52) U.S. Cl.
CPC .......... *H10P 72/0414* (2026.01); *H10P 72/15* (2026.01)

(58) Field of Classification Search
None
See application file for complete search history.

(56) References Cited

U.S. PATENT DOCUMENTS

| | | | |
|---|---|---|---|
| 8,356,951 B2 | 1/2013 | Noda et al. | |
| 8,652,344 B2 | 2/2014 | Tsurusaki et al. | |
| 2002/0104708 A1 | 8/2002 | Zelinski | |
| 2003/0116181 A1* | 6/2003 | Dunn ................. | H10P 72/0416 134/182 |
| 2004/0129221 A1 | 7/2004 | Brcka et al. | |
| 2005/0139319 A1 | 6/2005 | Sugano et al. | |

| | | |
|---|---|---|
| 2015/0114560 A1 | 4/2015 | Inoue |
| 2018/0277378 A1 | 9/2018 | Watanabe et al. |
| 2021/0118704 A1 | 4/2021 | Aratake et al. |

FOREIGN PATENT DOCUMENTS

| | | | |
|---|---|---|---|
| CN | 101555101 | | 10/2009 |
| JP | 2003286598 | | 10/2003 |
| JP | 2004327962 | | 11/2004 |
| WO | 2013027153 | | 2/2013 |
| WO | WO2022113971 | * | 6/2022 |

OTHER PUBLICATIONS

Translation of WO2022113971 by Sumi, published Jun. 2, 2022.*
Transmittal Of The International Search Report and The Written Opinion, Application No. PCT/US2025/010487; International Filing Date Jan. 6, 2025, Apr. 29, 2025, 10 pgs.

* cited by examiner

*Primary Examiner* — Kaj K Olsen
*Assistant Examiner* — Ryan L Coleman
(74) *Attorney, Agent, or Firm* — Egan, Enders & Huston LLP.

(57) ABSTRACT

The present disclosure provides improved wet processing systems and methods for processing a semiconductor wafer. More specifically, the present disclosure provides various embodiments of improved wet processing systems, liquid dispense nozzles and methods for dispensing a liquid that flows laterally across a surface of a semiconductor wafer with uniform flow velocity. The disclosed embodiments utilize a wafer support mechanism for supporting a semiconductor wafer and at least one elongated nozzle for dispensing a liquid onto the wafer support mechanism, such that the liquid flows in a lateral direction across the surface of the semiconductor wafer with uniform flow velocity across a direction perpendicular to the lateral direction.

21 Claims, 16 Drawing Sheets

320

322

A

324

A

320

322

324

326

W

322

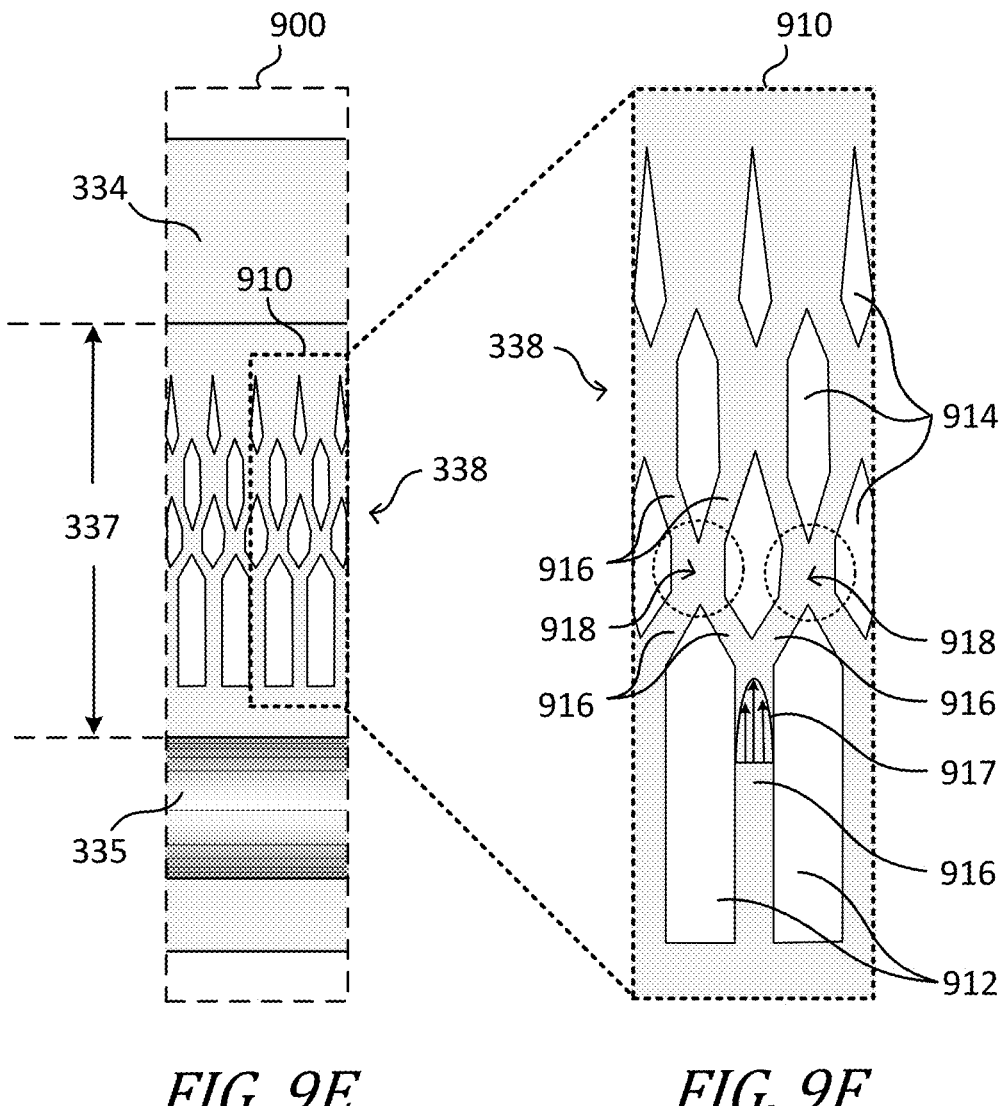
*FIG. 9E*        *FIG. 9F*

Figure 10:
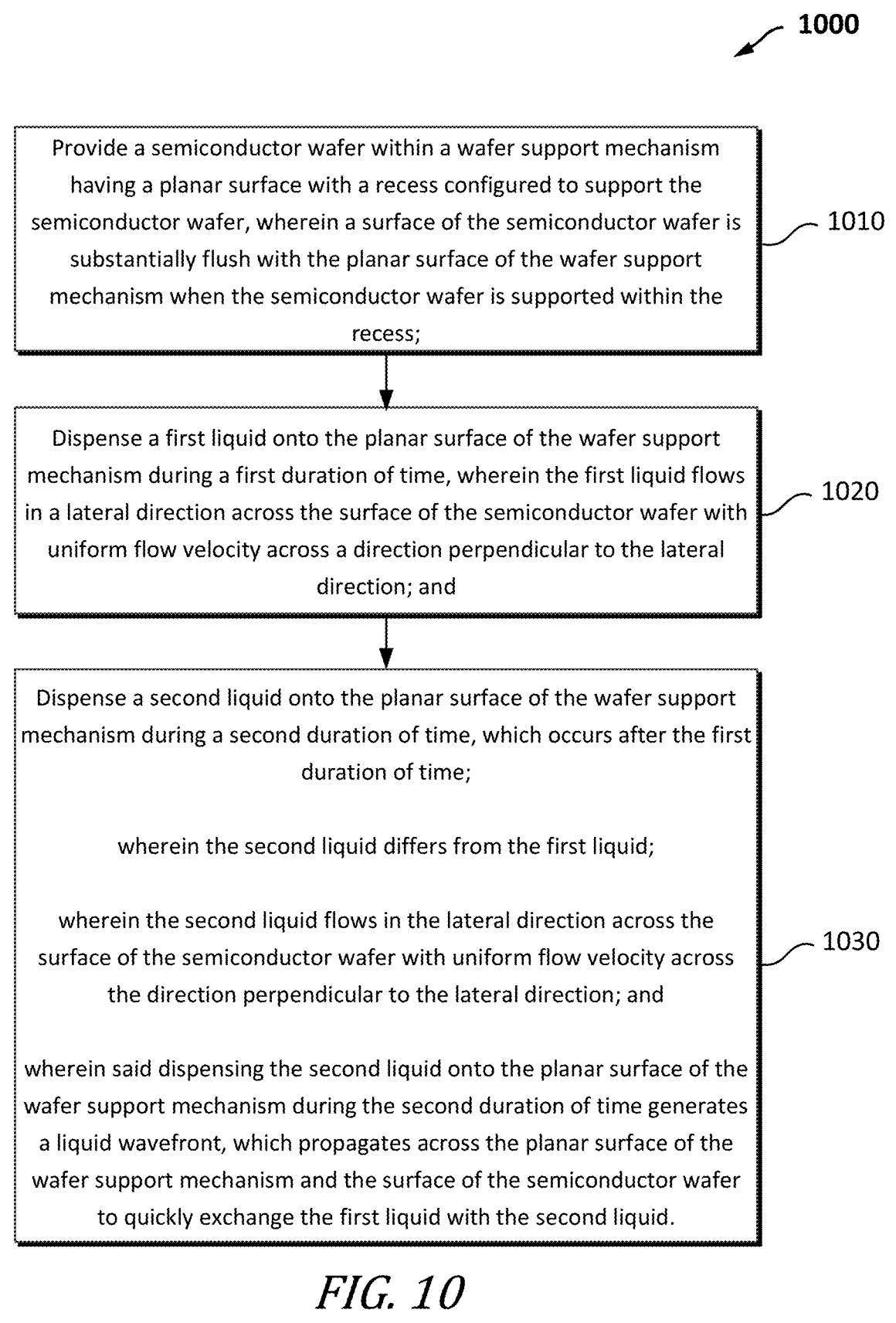

1000

Provide a semiconductor wafer within a wafer support mechanism having a planar surface with a recess configured to support the semiconductor wafer, wherein a surface of the semiconductor wafer is substantially flush with the planar surface of the wafer support mechanism when the semiconductor wafer is supported within the recess;

1010

Dispense a first liquid onto the planar surface of the wafer support mechanism during a first duration of time, wherein the first liquid flows in a lateral direction across the surface of the semiconductor wafer with uniform flow velocity across a direction perpendicular to the lateral direction; and

1020

Dispense a second liquid onto the planar surface of the wafer support mechanism during a second duration of time, which occurs after the first duration of time;

wherein the second liquid differs from the first liquid;

wherein the second liquid flows in the lateral direction across the surface of the semiconductor wafer with uniform flow velocity across the direction perpendicular to the lateral direction; and wherein said dispensing the second liquid onto the planar surface of the wafer support mechanism during the second duration of time generates a liquid wavefront, which propagates across the planar surface of the wafer support mechanism and the surface of the semiconductor wafer to quickly exchange the first liquid with the second liquid.

WET PROCESSING SYSTEM AND NOZZLE FOR DISPENSING A LIQUID LATERALLY ACROSS A SEMICONDUCTOR WAFER

BACKGROUND

The present disclosure relates to the processing of semiconductor substrates (or semiconductor wafers). In particular, it provides novel wet processing systems and methods for dispensing liquids that flow laterally across a semiconductor wafer.

Semiconductor fabrication processes may involve a wide variety of processing steps, including depositing, growing, patterning, etching, coating, developing and cleaning steps. Some of these processing steps can be performed as wet processes using various processing liquids. A wide variety of wet processing systems are known including single wafer wet processing systems, which use one or more nozzles to dispense one or more processing liquids onto the surface of a single semiconductor substrate, and batch processing systems which immerse a plurality (or batch) of substrates in a processing tank comprising a processing liquid or chemical solution.

FIG. 1 illustrates an example of a wet processing system 100 that can be used to process one semiconductor substrate at a time (i.e., a single wafer wet processing system). The wet processing system 100 shown in FIG. 1 is a spin chamber, which uses a spin chuck 110 and drive mechanism 115 (e.g., a stepper motor) to rotate or spin a semiconductor substrate (or wafer W) mounted onto the spin chuck 110, at least one liquid nozzle 120 for dispensing one or more liquids (L) received from a liquid supply line 125 onto the wafer surface while the semiconductor wafer is spinning, and a large cup 130 for capturing the liquids that are ejected from the wafer surface(s) by the centrifugal forces generated during rotation of the spin chuck 110. The liquid material ejected from the semiconductor wafer W and collected by the cup 130 is drained via a drain line 135 and drain unit (not shown). An exhaust line 137 and exhaust unit (not shown), such as a vacuum pump or other negative pressure-generating device, is provided within the wet processing system 100 to remove gaseous species (including but not limited to vapors released from substrate layers during processing) from the processing space inside the cup 130.

FIG. 2 illustrates an example of a wet processing system 200 that can be used to simultaneously process a plurality (or batch) of semiconductor substrates at a time. The wet processing system 200 shown in FIG. 2 is a batch processing system having a processing tank 210 for holding a processing liquid or chemical solution and a liquid supply line 220 for supplying the processing liquid or chemical solution to the processing tank 210. In the wet processing system 200, a plurality of semiconductor substrates (or wafers W) are immersed within the processing tank 210 and held in place, for example, by support members (not shown). The semiconductor substrates W can be immersed within the processing tank 210 for a period of time needed to process the substrates with a particular liquid L (e.g., a cleaning solution, rinse solution, etching solution or developing solution). In some cases, the semiconductor substrates W can be removed and immersed within another processing tank containing a different processing liquid to continue processing the substrates.

The wet processing systems shown in FIGS. 1 and 2 have various disadvantages. For example, the wet processing system 100 shown in FIG. 1 uses a spin chuck 110 to perform spin-on processing with superior uniformity and process performance on a single semiconductor wafer W. However, the hardware components required for spin-on processing (e.g., the spin chuck 110, drive mechanism 115 and large liquid capturing cup 130) consume a lot of space. The wet processing system 200 shown in FIG. 2 performs batch processing by placing a plurality of semiconductor wafers W within a large tank comprising a processing liquid or chemical solution. Because the processing liquid or chemical solution is injected below the semiconductor wafers W via liquid supply line 220, mixing is not uniform throughout the tank. In typical wet processing tanks, the wafer fronts face the backside of the next wafer. This exposes the wafer fronts to backside contaminants, as shown in FIG. 2.

In addition to the disadvantages mentioned above, current wet processes utilized within spin chambers and batch processing systems typically require a large amount of ultrapure chemicals. The high cost and large amount of ultrapure chemicals required in current wet cleaning processes, and the treatment of hazardous waste resulting from such processes, together with its incompatibility with the advanced concepts of integrated processing such as cluster tooling, require new wet processing systems and methods that are less affected by these limitations.

A need, therefore, remains for improved wet processing systems and methods for processing one or more semiconductor wafers. In particular, a need remains for a more compact, single wafer wet processing system that performs just as well as (if not better than) the wet processing system 100 shown in FIG. 1, and a batch processing system that avoids wafer-to-wafer cross contamination, while improving uniformity and process performance.

SUMMARY

The present disclosure provides improved wet processing systems and methods for processing a semiconductor wafer. More specifically, the present disclosure provides various embodiments of improved wet processing systems, liquid dispense nozzles and methods for dispensing a liquid that flows laterally across a surface of a semiconductor wafer with uniform flow velocity.

The disclosed embodiments utilize a wafer support mechanism (e.g., a wafer tray or wafer chamber) for supporting a semiconductor wafer and an elongated nozzle for dispensing a liquid onto the wafer support mechanism, such that the liquid flows in a lateral direction across the surface of the semiconductor wafer with uniform flow velocity across a direction perpendicular to the lateral direction. Unlike conventional wet processing systems, liquid dispense nozzles and methods, the embodiments disclosed herein provide: (a) uniform fluid flow across a wafer surface without spinning the wafer in a single wafer wet processing system, and (b) uniform fluid flow across all wafers provided within a processing tank of a batch processing system.

The elongated nozzle described herein utilizes a number of unique features to provide uniform flow across each wafer surface. Unlike conventional nozzles used in wet processing, the elongated nozzle described herein includes: (a) a high conductance fluid flow path for receiving a liquid from a liquid supply line, (b) an elongated output slot for dispensing the liquid onto the wafer support mechanism with uniform flow velocity, and (c) a low conductance fluid flow path which is coupled between the high conductance fluid flow path and the elongated output slot for regulating the flow velocity of the liquid and ensuring that the liquid is dispensed from the elongated output slot with uniform flow velocity.

According to one embodiment, a wet processing system is provided herein for processing a semiconductor substrate. In some embodiments, the wet processing system may include a wafer support mechanism having a planar surface with a recess configured to support a semiconductor wafer and at least one elongated nozzle coupled to the wafer support mechanism. When the semiconductor wafer is supported within the recess, a surface of the semiconductor wafer may be substantially flush with the planar surface of the wafer support mechanism, and the least one elongated nozzle may be configured to dispense a liquid onto the planar surface of the wafer support mechanism that flows in a lateral direction across the surface of the semiconductor wafer with uniform flow velocity across a direction perpendicular to the lateral direction.

In some embodiments, the at least one elongated nozzle may comprise a single elongated nozzle configured to dispense the liquid across the entire wafer surface. In other embodiments, the at least one elongated nozzle may comprise a pair of elongated nozzles, each configured to dispense the liquid across one-half of the semiconductor wafer.

Various embodiments of wafer support mechanisms are contemplated herein. In some embodiments, the wafer support mechanism may be a wafer tray having a planar surface and recess as described above. In such embodiments, the liquid dispensed by the at least one elongated nozzle may flow across the planar surface of the wafer tray and the surface of the semiconductor wafer supported within the recess of the wafer tray. In other embodiments, the wafer support mechanism may be a wafer chamber implemented as an open-ended box having a plurality of sides, comprising: (i) a back side comprising the planar surface with the recess for supporting the semiconductor wafer; (ii) a front side arranged opposite the back side; and (iii) a pair of opposing side surfaces that connect the front side to the back side to form a narrow channel between the front side and the back side. In such embodiments, the liquid dispensed by the at least one elongated nozzle may flow through the narrow channel from one open end of the narrow channel, across the surface of the semiconductor wafer, to an opposite open end of the narrow channel.

In some embodiments, the wet processing system may be a single wafer processing system configured for processing only one semiconductor wafer at a time. In a single wafer processing system, the wafer support mechanism and the at least one elongated nozzle may be arranged in a horizontal orientation, and the liquid dispensed by the at least one elongated nozzle may flow in a horizontal direction across the surface of the semiconductor wafer.

In other embodiments, the wet processing system may be a batch processing system, which is configured for simultaneously processing a plurality of semiconductor wafers at a time. In a batch processing system, the wafer support mechanism and the at least one elongated nozzle may be arranged in a vertical orientation, and the liquid dispensed by the at least one elongated nozzle may flow in a vertical direction across the surface of the semiconductor wafer.

When implemented as a batch processing system, the wet processing system may include a plurality of wafer support mechanisms, each having a planar surface with a recess configured to support a different one of the plurality of semiconductor wafers, and a plurality of elongated nozzles coupled to the plurality of wafer support mechanisms. The plurality of elongated nozzles included within the batch processing system may each dispense a liquid that flows in the vertical direction across a surface of a given semiconductor wafer with uniform flow velocity across a direction perpendicular to the vertical direction. The plurality of wafer support mechanisms included within the batch processing system isolate the plurality of semiconductor wafers from one another to avoid transferring contamination from one semiconductor wafer to another semiconductor wafer.

As disclosed further herein, the at least one elongated nozzle may generally include: (i) a high conductance fluid flow path coupled to receive the liquid from a liquid supply line; (ii) an elongated output slot configured to dispense the liquid onto the planar surface of the wafer support mechanism with the uniform flow velocity; and (iii) a low conductance fluid flow path coupled between the high conductance fluid flow path and the elongated output slot. The low conductance fluid flow path comprises a pattern of fluid flow obstructions, which regulate the flow velocity of the liquid passing through the low conductance fluid flow path to ensure that the liquid is dispensed from the elongated output slot with the uniform flow velocity.

As noted above, the at least one elongated nozzle may comprise a single elongated nozzle configured to dispense the liquid across the entire wafer surface, or a pair of elongated nozzles, each configured to dispense the liquid across one-half of the semiconductor wafer. When the at least one elongated nozzle comprises a single elongated nozzle, the length of the elongated output slot is greater than or equal to a diameter of the semiconductor wafer, so that the liquid dispensed from the elongated output slot flows laterally across the entire semiconductor wafer. When the at least one elongated nozzle comprises a pair of elongated nozzles, the length of the elongated output slot may be greater than a radius, but less than a diameter, of the semiconductor wafer, so that the liquid dispensed from the elongated output slot flows laterally across one-half of the semiconductor wafer.

The wet processing system may further include a liquid supply system and a controller. The liquid supply system may generally include: (i) a plurality of liquid reservoirs containing a plurality of liquids used to process the semiconductor wafer; and (ii) a manifold coupled between the plurality of liquid reservoirs and the liquid supply line for selectively supplying one of the plurality of liquids to the liquid supply line at a time. The controller is coupled to the liquid supply system for controlling which of the plurality of liquids is selectively supplied to the liquid supply line for a predetermined duration of time.

In some embodiments, the controller may be configured to control the liquid supply system to selectively supply to the liquid supply line: (i) a first liquid of the plurality of liquids during a first duration of time; and (ii) a second liquid of the plurality of liquids during a second duration of time, where the second liquid differs from the first liquid and the second duration of time occurs after the first duration of time. In some embodiments, selectively suppling the second liquid to the liquid supply line may generate a liquid wavefront, which propagates through the at least one elongated nozzle and across the planar surface of the wafer support mechanism and the surface of the semiconductor wafer to exchange the first liquid with the second liquid.

According to another embodiment, a method is provided herein for processing a semiconductor substrate. In some embodiments, the method may begin by providing a semiconductor wafer within a wafer support mechanism having a planar surface with a recess configured to support the semiconductor wafer, wherein a surface of the semiconductor wafer is substantially flush with the planar surface of the wafer support mechanism when the semiconductor wafer is supported within the recess. The method may further include dispensing a first liquid onto the planar surface of the wafer support mechanism during a first duration of time, wherein the first liquid flows in a lateral direction across the surface of the semiconductor wafer with uniform flow velocity across a direction perpendicular to the lateral direction.

In some embodiments, the method may further include dispensing a second liquid onto the planar surface of the wafer support mechanism during a second duration of time, which occurs after the first duration of time. The second liquid may differ from the first liquid and may flow in the lateral direction across the surface of the semiconductor wafer with uniform flow velocity across the direction perpendicular to the lateral direction. In some embodiments, dispensing the second liquid onto the planar surface of the wafer support mechanism during the second duration of time may generate a liquid wavefront, which propagates across the planar surface of the wafer support mechanism and the surface of the semiconductor wafer to exchange the first liquid with the second liquid.

In some embodiments, the first liquid and the second liquid may be dispensed from at least one elongated nozzle comprising: (i) a high conductance fluid flow path coupled to receive the first/second liquid from a liquid supply line; (ii) an elongated output slot configured to dispense the first/second liquid onto the planar surface of the wafer support mechanism with the uniform flow velocity; and (iii) a low conductance fluid flow path coupled between the high conductance fluid flow path and the elongated output slot. As noted above, the low conductance fluid flow path comprises a pattern of fluid flow obstructions, which regulate the flow velocity of the first/second liquid passing through the low conductance fluid flow path to ensure that the first/second liquid is dispensed from the elongated output slot with the uniform flow velocity. In some embodiments, the first liquid and the second liquid may be dispensed from a single elongated nozzle configured to dispense the first/second liquid across the entire wafer surface, or a pair of elongated nozzles, each configured to dispense the first/second liquid across one-half of the semiconductor wafer.

Various embodiments of wet processing systems and methods are provided herein for processing a substrate. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 9E is a cross-sectional view through the elongated nozzle shown in FIG. 9A illustrating the portion shown in box 900 of FIG. 9D.

FIG. 9F is a magnified view of the portion shown in box 910 of FIG. 9E.

FIG. 10 is a flowchart diagram illustrating one embodiment of a method that utilizes the techniques described herein to process a semiconductor substrate.

DETAILED DESCRIPTION

The present disclosure provides improved wet processing systems and methods for processing a semiconductor wafer.

More specifically, the present disclosure provides various embodiments of improved wet processing systems, liquid dispense nozzles and methods for dispensing a liquid that flows laterally across at least one surface of a semiconductor wafer with uniform flow velocity.

The disclosed embodiments utilize a wafer support mechanism (e.g., a wafer tray or wafer chamber) for supporting a semiconductor wafer and an elongated nozzle for dispensing a liquid onto the wafer support mechanism, such that the liquid flows in a lateral direction across at least one surface of the semiconductor wafer with uniform flow velocity across a direction perpendicular to the lateral direction. Unlike conventional wet processing systems, liquid dispense nozzles and methods, the embodiments disclosed herein provide: (a) uniform fluid flow across the wafer surface(s) without spinning the wafer in a single wafer wet processing system, and (b) uniform fluid flow across all wafers provided within a processing tank of a batch processing system.

The elongated nozzle described herein utilizes a number of unique features to provide uniform flow across each wafer surface. Unlike conventional nozzles used in wet processing, the elongated nozzle described herein includes: (a) a high conductance fluid flow path for receiving a liquid from a liquid supply line, (b) an elongated output slot for dispensing the liquid onto the wafer support mechanism with uniform flow velocity, and (c) a low conductance fluid flow path which is coupled between the high conductance fluid flow path and the elongated output slot for regulating the flow velocity of the liquid and ensuring that the liquid is dispensed from the elongated output slot with uniform flow velocity. One example of an elongated nozzle having a high conductance fluid flow path, a low conductance fluid flow path and an elongated output slot is shown in FIGS. 9A-9E and described in more detail below.

Figure 1:
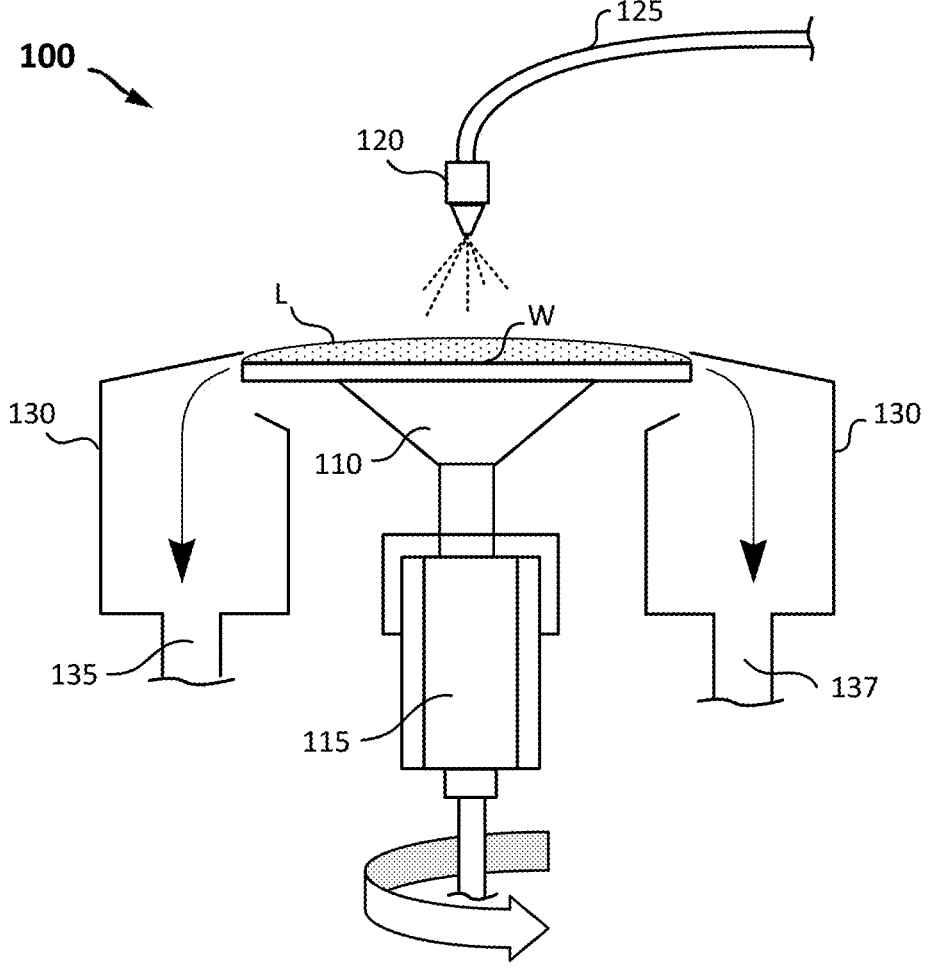
FIG. 1 (PRIOR ART) is a schematic view of an example wet processing system for processing a single semiconductor substrate at a time.
Figure 2:
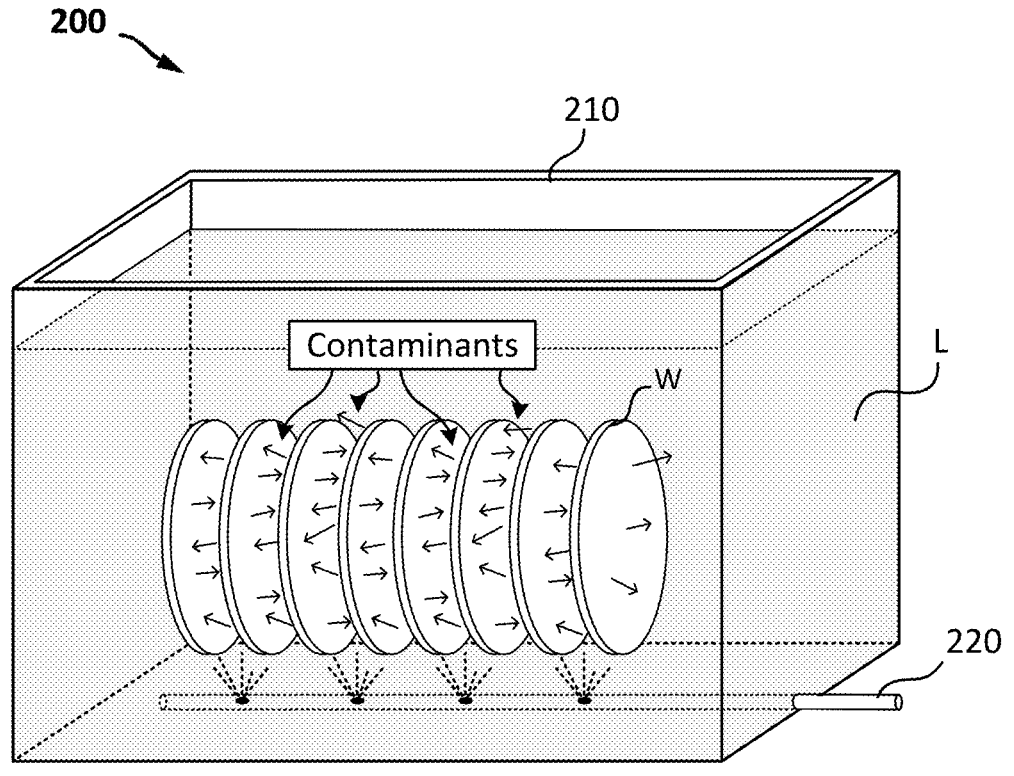
FIG. 2 (PRIOR ART) is a three-dimensional (3D) perspective view of an example wet processing system for simultaneously processing a plurality of semiconductor substrates at a time.
Figure 3:
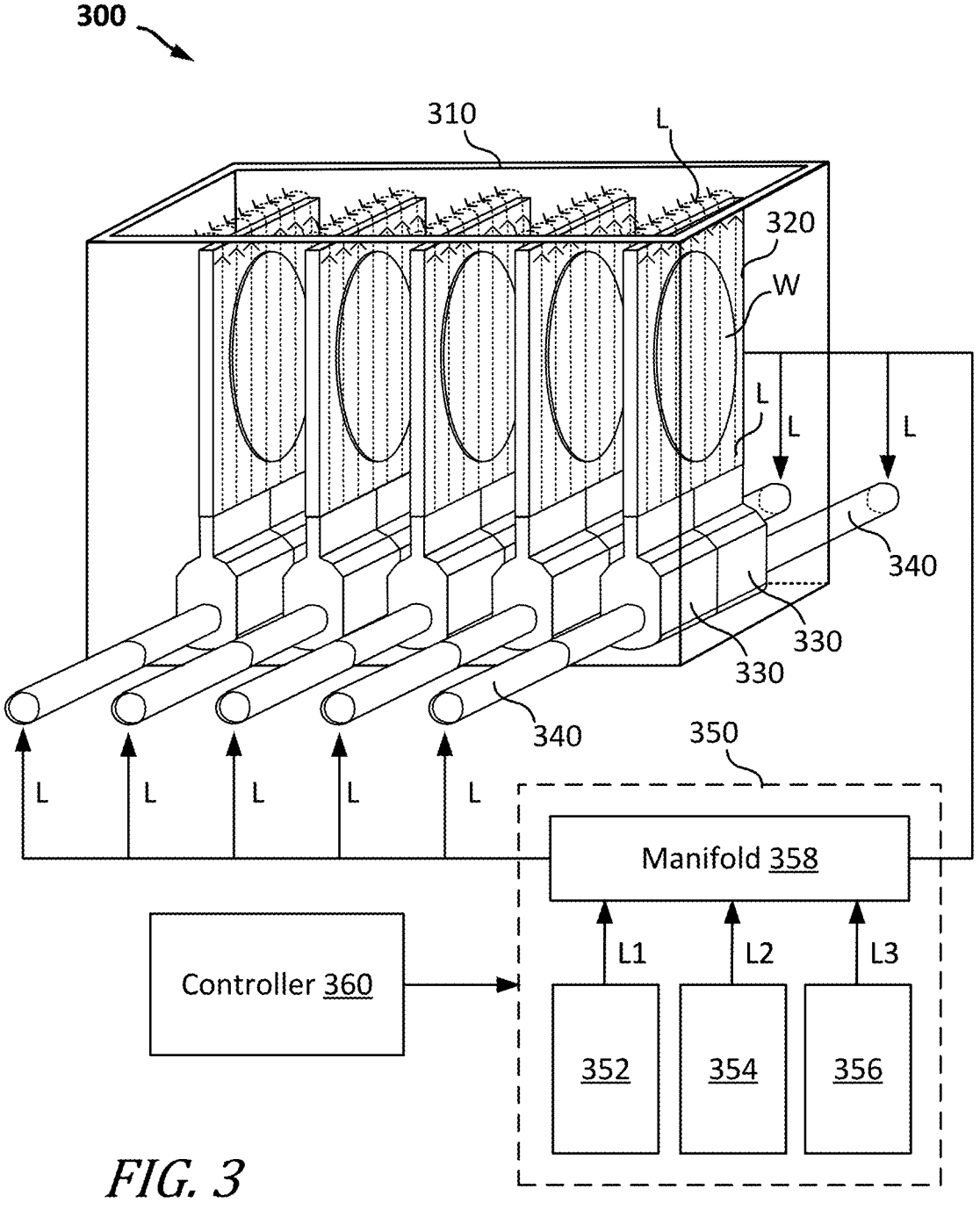
FIG. 3 is a 3D perspective view of a wet processing system in accordance with one embodiment of the present disclosure.

FIG. 3 illustrates one embodiment of a wet processing system 300 that utilizes the techniques described herein to process a semiconductor wafer. The wet processing system 300 shown in FIG. 3 is a batch processing system configured for simultaneously processing a plurality of semiconductor wafers (W) at a time. Although illustrated in FIG. 3 as a batch processing system, the techniques described herein can also be applied to a single wafer wet processing system, as described in more detail below in reference to FIG. 8.

The wet processing system 300 shown in FIG. 3 generally includes a processing tank 310 in which a plurality of wafer support mechanisms 320 and a plurality of elongated nozzles 330 are disposed in a substantially vertical orientation. Each wafer support mechanism 320 is configured to support a different one of the plurality of semiconductor wafers W. Examples of wafer support mechanisms are shown in FIGS. 4-5 and discussed in more detail below.

In the embodiment shown in FIG. 3, a pair of elongated nozzles 330 is coupled to each wafer support mechanism 320 for dispensing a liquid (L) onto a planar surface of the wafer support mechanism 320, such that the liquid flows in a lateral direction across at least one surface of the semiconductor wafer W with uniform flow velocity (v) across a direction perpendicular to the lateral direction (i.e., the fluid flow direction across the wafer surface). Each of the elongated nozzles 330 shown in FIG. 3 is configured to dispense liquid across one-half of the semiconductor wafer W. Although a pair of elongated nozzles 330 is used in FIG. 3 to dispense liquid across one-half of the wafer surface, a single elongated nozzle 330 may alternatively be used to dispense liquid across the entire wafer surface as shown, for example, in FIG. 6 and described in more detail below.

In the example embodiment shown in FIG. 3, the elongated nozzles 330 are configured for dispensing liquid onto the wafer support mechanism 320, such that the liquid flows laterally across one surface (e.g., a front surface) of the semiconductor wafer W, as discussed in more detail below. In other embodiments, the elongated nozzles 330 may dispense liquid onto the wafer support mechanism 320, such that the liquid flows laterally across two opposing surfaces (e.g., a front surface and a back surface) of the semiconductor wafer W.

Figure 6:
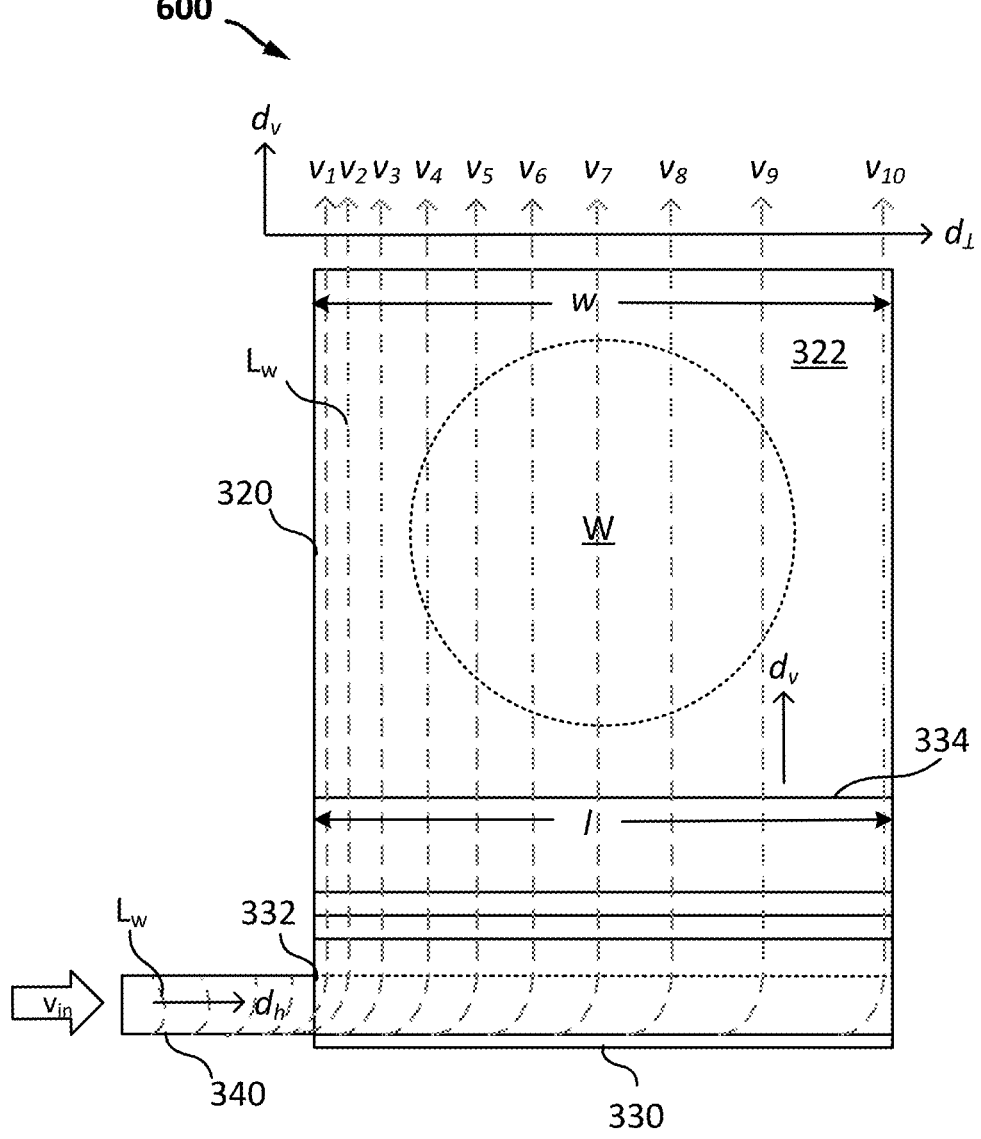
FIG. 6 is a front view of a wafer support mechanism coupled to a single elongated nozzle and liquid supply line, illustrating propagation of a liquid wavefront $(L_w)$ through the elongated nozzle and across a surface of a semiconductor substrate provided within the wafer support mechanism.
Figure 7:
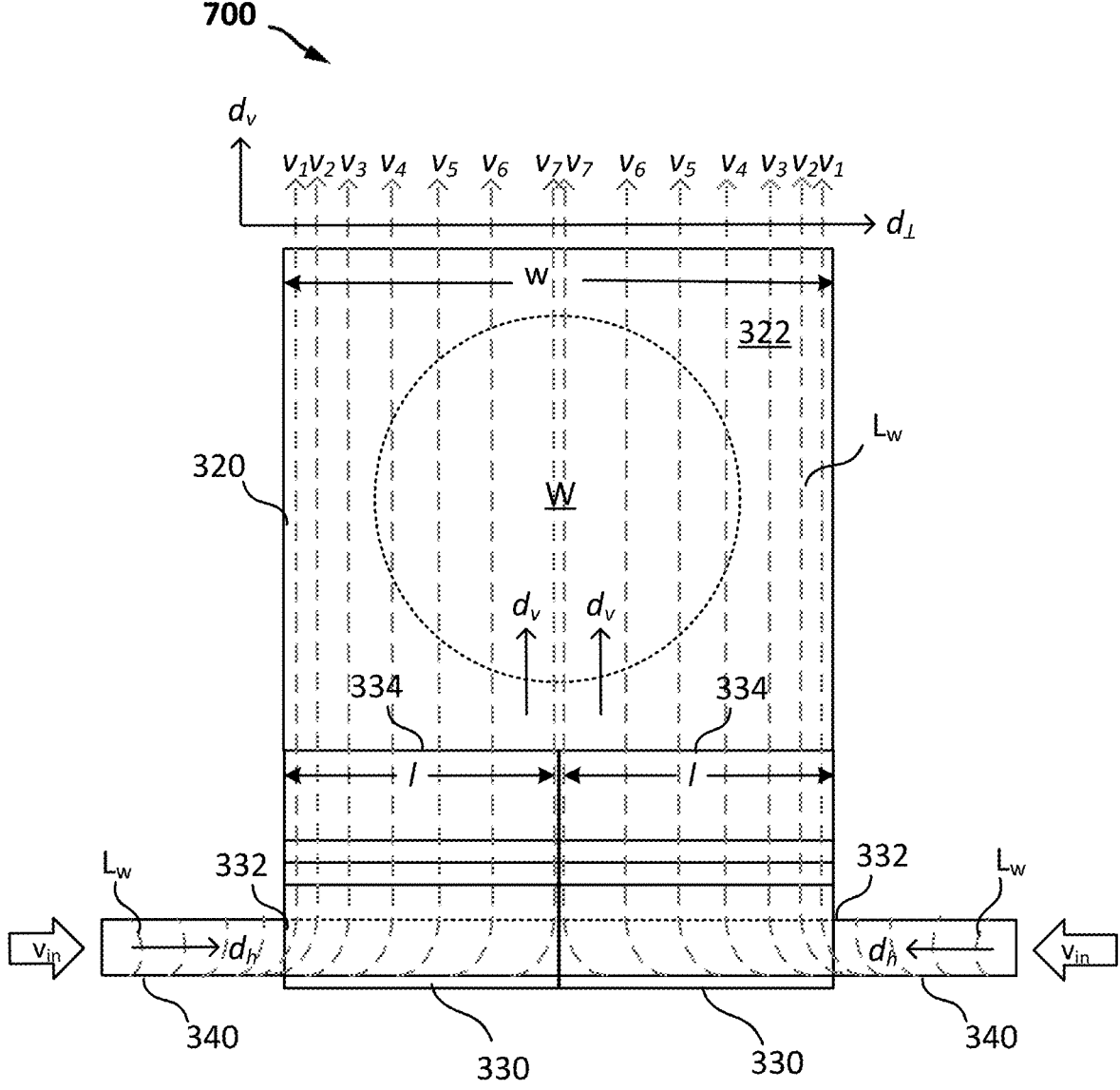
FIG. 7 is a front view of a wafer support mechanism coupled to a pair of elongated nozzles and liquid supply lines, illustrating propagation of a liquid wavefront $(L_w)$ through the pair of elongated nozzles and across a surface of a semiconductor substrate provided within the wafer support mechanism.
Figure 8:
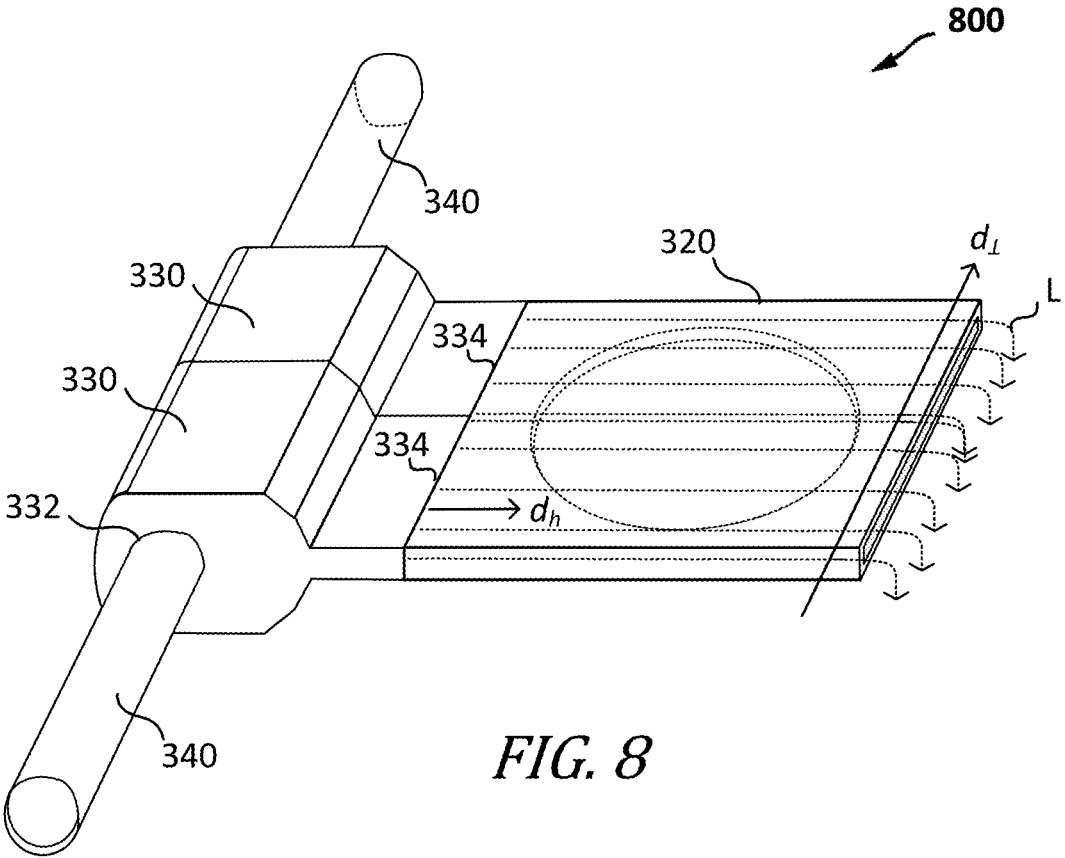
FIG. 8 is a 3D perspective view of a wafer support mechanism coupled to a pair of elongated nozzles and liquid supply lines arranged in a horizontal, rather than vertical, orientation.

As used herein and depicted in FIGS. 6-8, the lateral direction refers to the direction of fluid flow across the wafer surface(s) from one edge of the semiconductor wafer W to an opposite edge of the semiconductor wafer. The direction of fluid flow across the wafer surface(s) (i.e., the lateral direction) may be vertical or horizontal in various embodiments. When the wafer support mechanism 320 and the elongated nozzle(s) 330 are arranged in a vertical orientation, for example, the liquid (L) dispensed by the elongated nozzle(s) 330 onto the planar surface of the wafer support mechanism 320 flows in a substantially vertical direction $(d_v)$ across the surface(s) of the semiconductor wafer W, as shown in the embodiments depicted in FIGS. 3, 6 and 7. When the wafer support mechanism 320 and the elongated nozzle(s) 330 are arranged in a horizontal orientation, as shown in the embodiment of FIG. 8, the liquid (L) dispensed by the elongated nozzles 330 onto the planar surface of the wafer support mechanism 320 flows in a substantially horizontal direction $(d_h)$ across the surface(s) of the semiconductor wafer W.

Regardless of orientation, the liquid (L) dispensed by the elongated nozzle(s) 330 flows laterally across the wafer surface(s) with uniform flow velocity (v) across a direction $(d_\perp)$ perpendicular to the direction of fluid flow across the wafer surface(s). As depicted in FIGS. 6-8, the direction $(d_\perp)$ perpendicular to the direction of fluid flow across the wafer surface(s) lies in a plane parallel to the wafer surface(s). Thus, the flow velocity (v) of the liquid (L) across the wafer surface(s) is uniform (or substantially equal in velocity) across the direction (di) perpendicular to the direction of fluid flow (i.e., the lateral direction).

In the embodiment shown in FIG. 3, the pair of elongated nozzles 330 are positioned near the bottom of the processing tank 310. Each elongated nozzle 330 is coupled to a liquid supply line 340 for receiving a liquid (L) from a liquid supply system 350. As shown schematically in FIG. 3, the liquid supply system 350 may generally include: (a) one or more liquid reservoirs (such as liquid reservoirs 352, 354 and 356), each containing a liquid (e.g., L1, L2 and L3) that can be used to process the semiconductor wafers W, and (b) a manifold 358 (or another fluid flow component), which is coupled between the liquid reservoir(s) and the liquid supply lines 340 for selectively supplying one or more of the liquids stored within the liquid reservoirs to the liquid supply lines 340. A wide variety of liquids can be stored within the liquid reservoirs and used to process the semiconductor wafers W. Examples of processing liquids include, but are not limited to, cleaning solutions, rinse solutions, coating solutions, etching solutions, developing solutions, etc.

Components of the wet processing system 300 can be coupled to, and controlled by, a controller 360, which in turn, can be coupled to a corresponding memory storage unit and user interface (not shown). Various processing operations can be executed via the user interface, and various process recipes and operations can be stored within the memory storage unit. Accordingly, the semiconductor wafers W disposed within the wet processing system 300 can be processed in accordance with a particular process recipe. In some embodiments, the semiconductor wafers W can be processed in accordance with a process recipe, which selectively supplies one or more liquids to the semiconductor wafers W (via the liquid supply lines 340 and elongated nozzles 330) where each liquid is selectively supplied, one at a time, for a predetermined duration of time.

The controller 360 shown in block diagram form in FIG. 3 can be implemented in a wide variety of manners. In one example, the controller 360 may be a computer. In another example, the controller 360 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a predetermined process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits can cause the programmable integrated circuits to perform the processes, functions, and/or capabilities described herein. Other variations could also be implemented.

As shown in FIG. 3, the controller 360 is coupled to the liquid supply system 350 for controlling the liquid(s) supplied by the liquid supply system 350 to the liquid supply lines 340. In some embodiments, the controller 360 may supply control signals to the manifold 358 (or another fluid flow component) to control which liquid(s) (e.g., L1, L2 and/or L3) is/are selectively supplied to the liquid supply lines 340, the order in which the liquid(s) are supplied to the liquid supply lines 340 and/or the duration of time the liquid(s) are supplied to the liquid supply lines 340.

A wide variety of liquids can be selectively supplied to the liquid supply lines 340 depending on the process, or process step, being performed within the wet processing system 300. During a cleaning process, for example, the controller 360 may supply control signals to the liquid supply system 350 to selectively supply a cleaning solution and/or a rinse solution to the liquid supply lines 340 for cleaning and/or rinsing exposed surfaces of the semiconductor wafers W mounted within wafer support mechanisms 320. Examples of cleaning solutions include, but are not limited to, an ammonia/peroxide mixture (APM), a hydrochloric/peroxide mixture (HPM), a sulfuric peroxide mixture (SPM) and a hydrofluoric (HF) acid solution. Examples of rinse solutions include, but are not limited to, deionized (DI) water and isopropyl alcohol (IPA). Other cleaning solutions and rinse solutions can also be utilized to clean and/or rinse the semiconductor wafers W. In some embodiments, the controller 360 may supply control signals to the liquid supply system 350 to selectively supply a wetting solution (e.g., IPA) to the liquid supply lines 340 for pre-wetting exposed surfaces of the semiconductor wafers W mounted within wafer support mechanisms 320 prior to performing subsequent processing steps(s) on the exposed surfaces.

Alternatively, the controller 360 may supply control signals to the liquid supply system 350 to selectively supply: (a) a coating solution to the liquid supply lines 340 for coating the wafer surfaces with a liquid material, (b) an etching solution to the liquid supply lines 340 for etching one or more layers exposed on the wafer surfaces, or (c) a developing solution to the liquid supply lines 340 for developing one or more layers on the wafer surfaces previously exposed to actinic radiation. For example, the controller 360 may supply control signals to the liquid supply system 350 to selectively supply a pulsed sequence of different solutions (e.g., a first solution and a second solution separated by a rinse solution) to the liquid supply lines 340 to deposit a liquid material onto the wafer surfaces or etch one or more layers exposed on the wafer surfaces. This enables the wet processing system 300 shown in FIG. 3 to be used for wet atomic layer deposition (ALD) or wet atomic layer etching (ALE) processing.

In some embodiments, the controller 360 may supply control signals to the liquid supply system 350 to supply a plurality of liquids to the liquid supply lines 340, where each liquid is supplied one at a time for a predetermined duration of time. For example, the control signals supplied by the controller 360 may cause the liquid supply system 350 to supply a first liquid (e.g., L1) to the liquid supply lines 340 during a first duration of time and a second liquid (e.g., L2) to the liquid supply lines 340 during a second duration of time, which occurs sometime after the first duration of time. The second liquid may be the same or different from the first liquid. In one example, the first liquid may be a cleaning solution and the second liquid may be a rinse solution.

In some embodiments, the control signals supplied by the controller 360 may cause the first liquid and the second liquid to be supplied to the liquid supply lines 340 in a pulsed sequence by supplying the second liquid immediately after the first liquid. When the second liquid is supplied to the liquid supply lines 340, a liquid wavefront is generated that propagates through the liquid supply lines 340 and the elongated nozzles 330 to push the first liquid out of the elongated nozzles 330 and across the surface(s) of the semiconductor wafers W with minimal mixing between the first and second liquids. Due to the unique characteristics of the elongated nozzles 330, the liquid wavefront of each liquid injected into the liquid supply lines 340 progresses laterally across the wafer surface(s), with each subsequent pulse following the same pattern. This enables process chemistry to be quickly and efficiently changed, while ensuring the time of exposure for each chemistry is uniform across the wafer.

When performing an etch process within the wet processing system 300, etch uniformity is affected by concentration, temperature and time. Concentration and temperature are maintained by the streamline flow and chemical replacement provided by the elongated nozzles 330. Exposure time is also maintained by the wavefront pulse. When etch chemistry is introduced into the wet processing system 300 (e.g., from the bottom of the chamber as shown in FIG. 3), the exposure progresses across the wafer surface(s) and the fill rate determines the time difference between the start of exposure at the bottom and the top of the semiconductor wafers W. This time difference can be balanced by a purge/rinse pulse that pushes out the etch pulse, since the bottom of the wafers are exposed first and the top last. If the same flow rate is used for the two pulses, the time difference should be approximately the same, therefore the exposure time for the top and bottom of the wafers should also be approximately the same.

In some cases, liquid diffusion or dilution may assist in the exchange of one liquid to another. For example, if the first liquid is difficult to remove from the walls of the elongated nozzles 330, the second liquid can be pulsed to displace the bulk of the first liquid followed by a pause, which allows remnants of the first liquid to diffuse into the second liquid. If the first liquid is an etching chemistry and the second liquid is a rinse solution, the pause may temporarily dilute the etching chemistry. As dilution may greatly diminish the etch/deposition rate in the area, the pause period may need to be balanced with etch/deposition potential. In some cases, the second liquid (e.g., the rinse solution) may be pulsed again or pushed out with the remaining process fluid dissolved in with the next liquid supplied to the elongated nozzles 330 to complete the liquid exchange.

When exchanging chemistries having different viscosities, the change in viscosity can be phased in by blending the two chemistries. For example, if the first liquid is a low viscosity fluid and the second liquid is a high viscosity fluid, a first pulse supplied to the elongated nozzles 330 may be a blend of the first and second liquids to create a viscosity near that of the low viscosity fluid. Subsequent pulses supplied to the elongated nozzles 330 may combine the first and second liquids to gradually increase the viscosity until a final pulse is supplied with the high viscosity fluid.

As noted above, the wafer support mechanisms 320 and the elongated nozzles 330 are arranged in a vertical orientation in the embodiment shown in FIG. 3. When oriented vertically, the liquid (L) dispensed by the elongated nozzles 330 flows in a vertical direction across the surface(s) of the semiconductor wafers W before spilling over the top of the wafer support mechanisms 320 into the processing tank 310. A drain (not shown in FIG. 3) is provided near the bottom of the processing tank 310 for draining the liquid(s) used to process the semiconductor wafers W and the by-products generated during such processing. Unlike conventional batch processing systems, which immerse a plurality of semiconductor wafers within a processing liquid, the wafer support mechanisms 320 shown in FIG. 3 provide a physical barrier, which isolates the semiconductor wafers W from one another to avoid transferring processing by-products and contamination from one semiconductor wafer to another.

Various embodiments of wafer support mechanisms 320 are illustrated in FIGS. 4-5. As described in more detail below, each wafer support mechanism 320 includes a planar surface 322 with a recess 324 formed therein. The recess 324 is configured to support a semiconductor wafer W, such that a surface of the semiconductor wafer W is substantially flush with the planar surface 322 of the wafer support mechanism 320 when the semiconductor substrate W is supported within the recess 324.

Figure 4A:
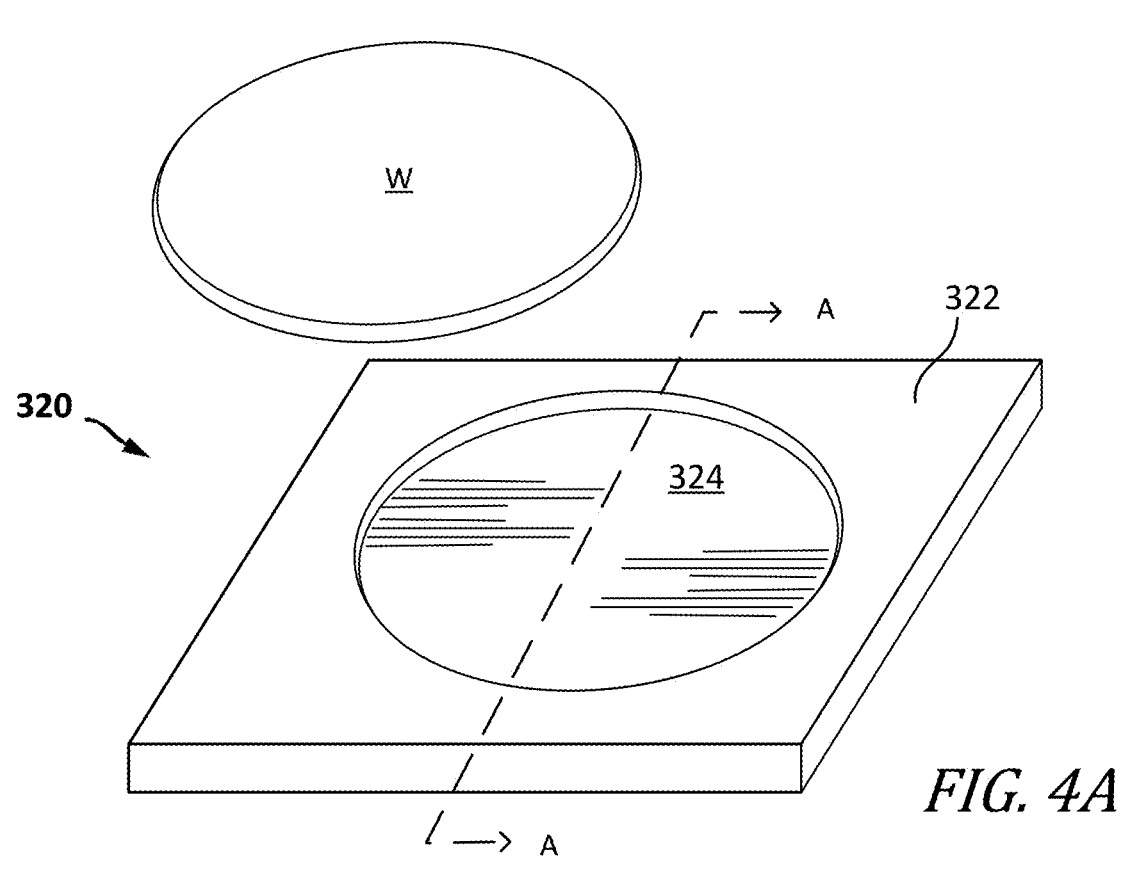
FIG. 4A is a 3D perspective view of a wafer support mechanism (wafer tray) in accordance with one embodiment of the present disclosure.
Figure 4B:
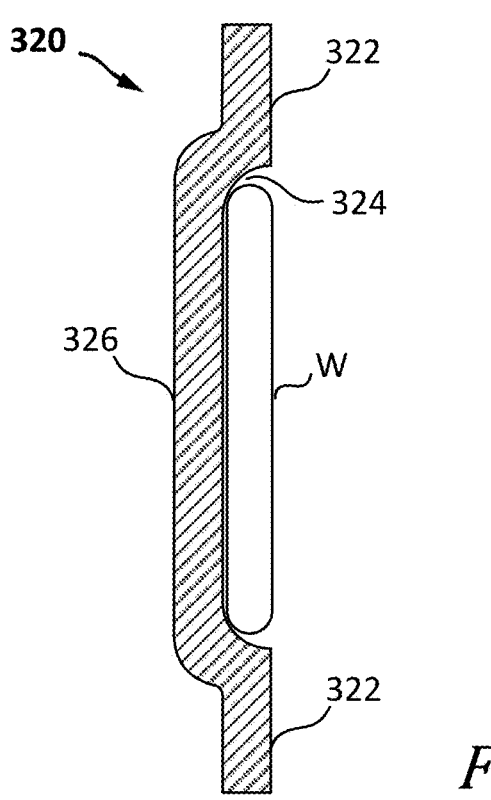
FIG. 4B is a cross-sectional view through line A-A of FIG. 4A.

FIGS. 4A-4B illustrate one embodiment of a wafer support mechanism 320 in accordance with the present disclosure. In the embodiment shown in FIGS. 4A-4B, the wafer support mechanism 320 is a wafer tray having a planar surface 322 with a recess 324 formed therein for supporting a single semiconductor wafer W. When a semiconductor wafer W is provided within the recess 324, the wafer surface to be processed is substantially flush with the planar surface 322 of the wafer support mechanism 320, as shown in FIG. 4B. This enables liquid dispensed by the elongated nozzles 330 to flow laterally across the planar surface 322 of the wafer support mechanism 320 and the wafer surface with minimal obstruction to fluid flow. As shown in FIG. 4B, the wafer support mechanism 320 further includes a backside surface 326, which is configured to support and protect an opposing surface of the semiconductor wafer W (i.e., the wafer surface opposing the wafer surface to be processed) mounted within the recess 324.

As shown in FIGS. 4A-4B, the recess 324 is substantially circular in shape, has a diameter that is slightly larger than the diameter of the semiconductor wafer W, and a depth substantially equal to the thickness of the semiconductor wafer W. The diameter and depth of the recess 324 may generally depend on the size of the wafers to be processed. When configured for supporting 300 mm wafers, for example, the recess 324 may have a diameter ranging between 302 mm and 310 mm and a depth ranging between 500 μm and 5 mm.

In the embodiment shown in FIGS. 4A-4B, the wafer support mechanism 320 exposes only one wafer surface for processing, while providing a physical barrier (the backside surface 326) that protects the opposite wafer surface (e.g., from by-products or contamination that could be transferred during batch processing from one semiconductor wafer to another). While the embodiment shown in FIGS. 4A-4B allows liquid dispensed from the elongated nozzle(s) 330 to flow laterally across only one wafer surface, the wafer support mechanism 320 could be modified to allow fluid flow across two opposing surfaces (e.g., a front surface and a back surface) of the semiconductor wafer W. For example, the wafer support mechanism 320 could be configured to support only the edges of the semiconductor wafer W, while leaving the front and back surfaces of the wafer exposed.

Figure 4C:
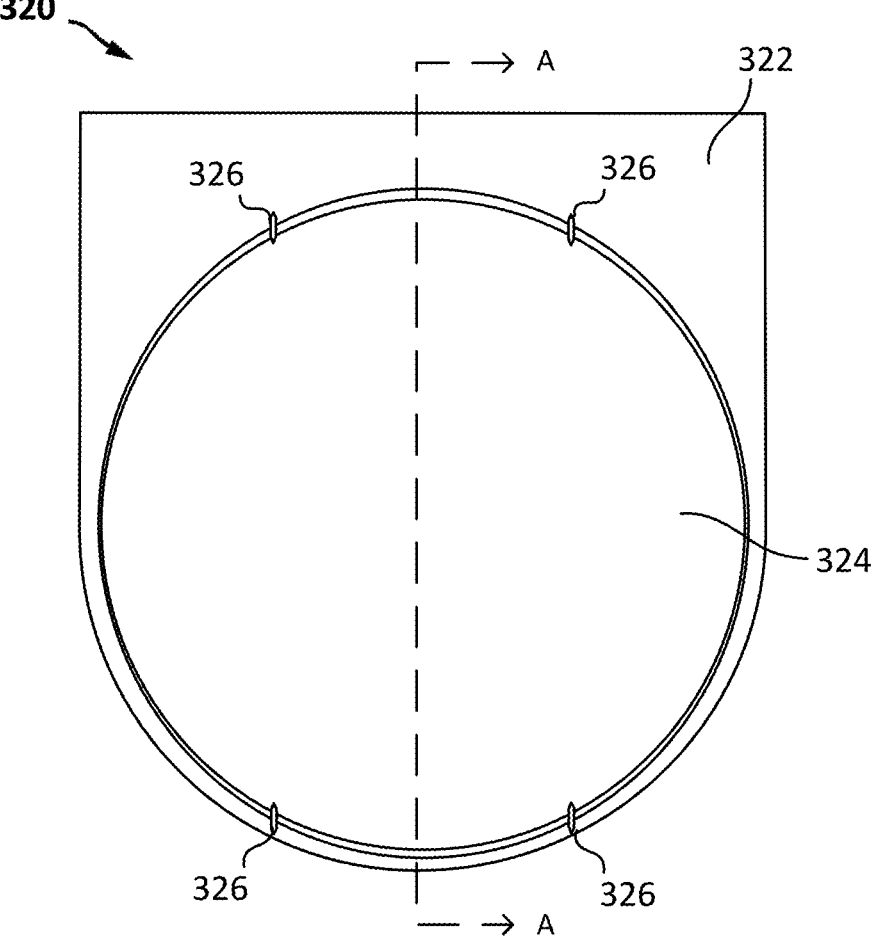
FIG. 4C is a front view of a wafer support mechanism (wafer tray) in accordance with another embodiment of the present disclosure.
Figure 4D:
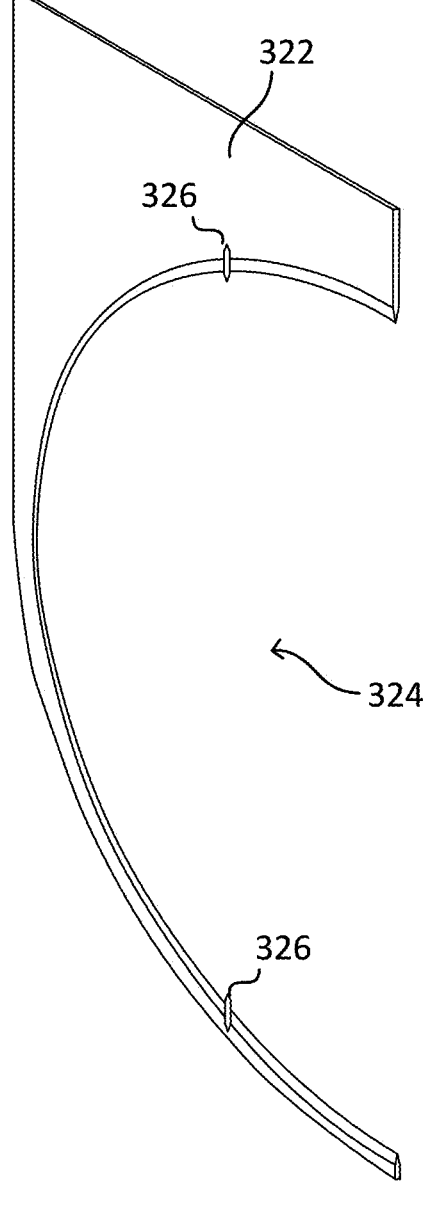
FIG. 4D is a 3D perspective cross-sectional view through line A-A of FIG. 4C, illustrating one half of the wafer support mechanism shown in FIG. 4C.

FIGS. 4C-4D illustrate another embodiment of a wafer support mechanism 320 in accordance with the present disclosure. In the embodiment shown in FIGS. 4C-4D, the wafer support mechanism 320 is a wafer tray having a planar surface 322 with a recess 324 formed therein for supporting a single semiconductor wafer W. Unlike the previous embodiment shown in FIGS. 4A-4B, the wafer support mechanism 320 shown in FIGS. 4C-4D does not include a backside surface 326. Instead of a backside surface 326, the wafer support mechanism 320 shown in FIGS. 4C-4D includes a plurality of edge supports 328, which are spaced around the periphery of the recess 324 for supporting the edges of a semiconductor wafer W mounted within the recess 324, leaving the front and back surfaces of the wafer exposed for processing.

Figures 5A, 5B:
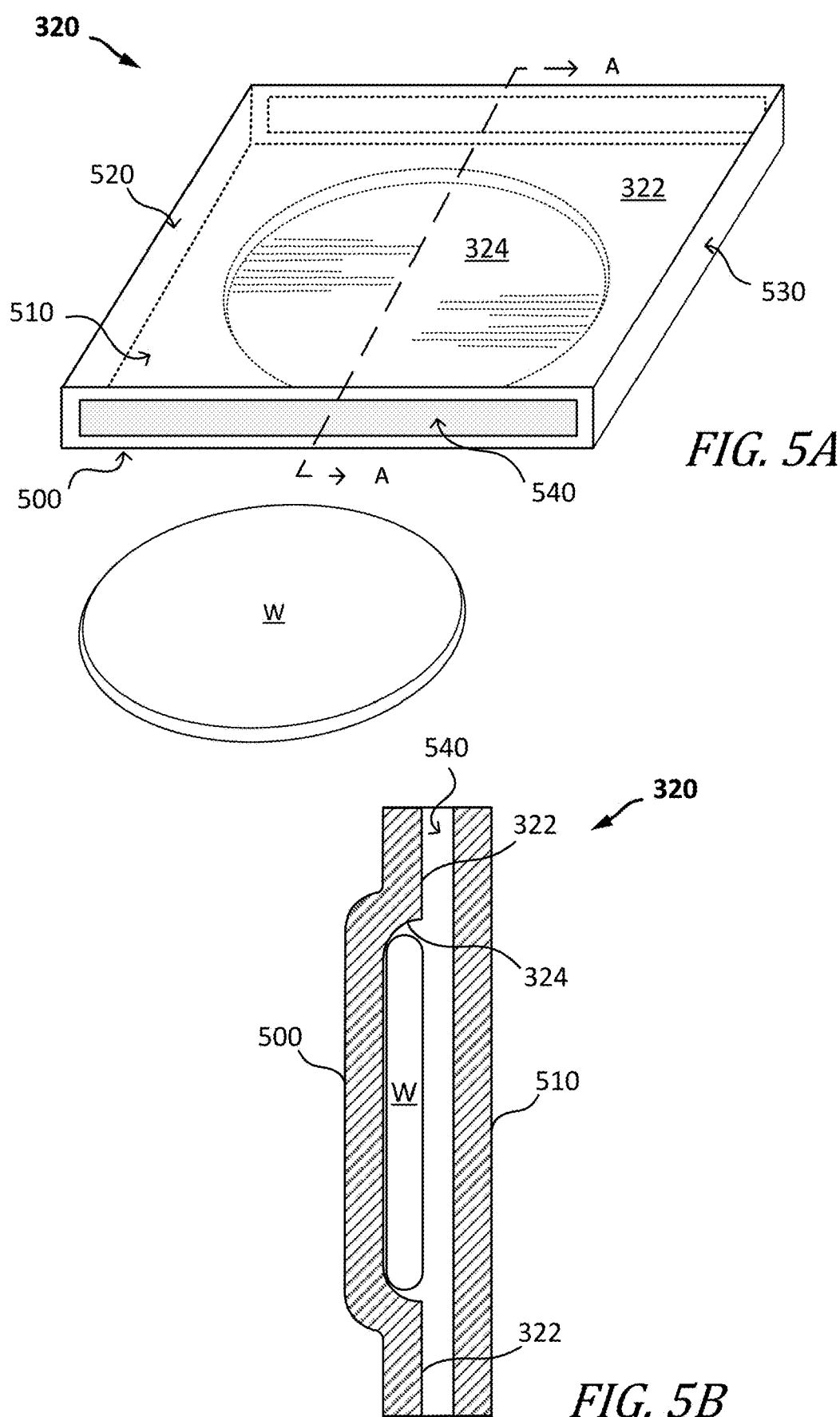
FIG. 5A is a 3D perspective view of a wafer support mechanism (wafer chamber) in accordance with yet another embodiment of the present disclosure.
FIG. 5B is a cross-sectional view through line A-A of FIG. 5A.

FIGS. 5A-5B illustrate yet another embodiment of a wafer support mechanism 320 in accordance with the present disclosure. The wafer support mechanism 320 shown in FIGS. 5A-5B is a wafer chamber implemented as an open-ended box having a plurality of sides. The plurality of sides includes a back side 500, a front side 510 arranged opposite the back side 500, and a pair of opposing side surfaces 520 and 530 that connect the front side 510 to the back side 500 to form a narrow channel 540 there between. The back side 500 of the wafer chamber includes a planar surface 322 with a recess 324 for supporting a single semiconductor wafer W. Like the embodiment shown in FIGS. 4A-4B, the recess 324 shown in FIGS. 5A-5B is a substantially circular in shape and has a diameter, which is slightly larger than the diameter of the semiconductor wafer W, and a depth substantially equal to the thickness of the semiconductor wafer W. When a semiconductor wafer W is provided within the recess 324, the wafer surface to be processed is substantially flush with the planar surface 322 of the wafer support mechanism 320, as shown in FIG. 5B. Unlike the embodiment previously shown in FIGS. 4A-4B, however, the liquid dispensed by the elongated nozzles 330 flows through the narrow channel 540 from one open end of the narrow channel 540, across the exposed surface of the semiconductor wafer W, to an opposite open end of the narrow channel 540. Thus, the embodiment shown in FIGS. 5A-5B provides a wafer chamber with a narrow channel 540 for directing fluid flow across the exposed surface of the semiconductor wafer W.

FIGS. 6-7 illustrate how the liquid injected into the liquid supply lines 340 generates a liquid wavefront ($L_w$), which propagates through the elongated nozzle(s) 330 to flow laterally across the planar surface 322 of the wafer support mechanism 320 and the exposed surface(s) of a semiconductor wafer W supported by the wafer support mechanism 320. The wafer support mechanism 320 shown in FIGS. 6 and 7 may be a wafer tray as shown in FIGS. 4A-4D, or a wafer chamber as shown in FIGS. 5A-5B. Depending on the wafer support mechanism 320 used, the liquid wavefront ($L_w$) shown in FIGS. 6-7 may flow laterally across only one wafer surface, or across two opposing wafer surfaces, as described above.

In the embodiments shown FIGS. 6-7, the liquid wavefront ($L_w$) flows in a substantially horizontal direction ($d_h$) through the liquid supply lines 340 into an input port 332 of the elongated nozzle(s) 330. The elongated nozzle(s) 330 receive the liquid from the liquid supply lines 340 and redirect the fluid flow approximately 90° to elongated output slot(s) 334, which dispense the liquid onto the planar surface 322 of the wafer support mechanism 320. The liquid dispensed from the elongated output slot(s) 334 flows in a substantially vertical direction ($d_v$) across the planar surface 322 of the wafer support mechanism 320 and the semiconductor wafer W with substantially uniform flow velocity (v) across a direction ($d_\perp$) perpendicular to the direction of fluid flow across the wafer surface (e.g., the vertical direction, $d_v$). As noted above and depicted in FIGS. 6-7, the direction ($d_\perp$) perpendicular to the direction of fluid flow across the wafer surface lies in a plane parallel to the wafer surface. Thus, the flow velocity (v) of the liquid wavefront ($L_w$) is uniform (or substantially equal in velocity) across the direction ($d_\perp$) perpendicular to the direction of fluid flow.

FIG. 6 depicts an embodiment 600 in which the wafer support mechanism 320 is coupled to a single elongated nozzle 330 and liquid supply line 340. The elongated nozzle 330 shown in FIG. 6 has an input port 332 for receiving liquid from an attached liquid supply line 340 at an input flow velocity ($v_{in}$), a fluid flow path (not shown in FIG. 6) for redirecting the fluid flow approximately 90°, and an elongated output slot 334 for dispensing the liquid across the entire surface of the semiconductor wafer W at an output flow velocity ($v_1 \ldots v_{10}$). In order to dispense liquid across the entire wafer surface, the length (l) of the elongated output slot 334 shown in FIG. 6 must be greater than or equal to the diameter of the semiconductor wafer W. In the embodiment 600 shown in FIG. 6, the length (l) of the elongated output slot 334 is substantially equal to the width (w) of the wafer support mechanism 320, which is greater than the diameter of the semiconductor wafer W.

As described in more detail below in reference to FIGS. 9A-9F, the elongated nozzle 330 shown in FIG. 6 includes a number of unique features, which redirect the fluid flow of the liquid supplied to the input port 332 and regulate the flow velocity of the liquid dispensed from the elongated output slot 334, such that the output flow velocity ($v_1 \ldots v_{10}$) is uniform (or substantially equal in velocity) across the direction ($d_\perp$) perpendicular to the direction of fluid flow. However, the output flow velocity ($v_1 \ldots v_{10}$) of the liquid dispensed from the elongated output slot 334 is at least partially dependent on the flow velocity of the liquid supplied to the input port 332 (i.e., the input flow velocity, $v_{in}$). In some cases, it may be difficult to maintain uniform output flow velocity across the entire wafer surface when a single elongated nozzle 330 is used as shown in FIG. 6. For example, the fluid pressure within the elongated nozzle is typically higher at the input port 332 and lower near the opposite end. In some cases, the pressure gradient across the elongated nozzle 330 may be high enough to create a significant flow variation from one side of the nozzle to the other that may adversely affect the uniformity of the fluid flow output from the elongated output slot 334.

FIG. 7 depicts an embodiment 700 in which the wafer support mechanism 320 is coupled to a pair of elongated nozzles 330 and liquid supply lines 340, as shown in FIG. 3 and described above. Each elongated nozzle 330 shown in FIG. 7 has an input port 332 for receiving liquid from an attached liquid supply line 340 at an input flow velocity ($v_{in}$), a fluid flow path (not shown in FIG. 7) for redirecting the fluid flow approximately 90°, and an elongated output slot 334 for dispensing the liquid across one-half of the semiconductor wafer W at an output flow velocity ($v_1 \ldots v_7$). In order to dispense liquid across one-half of the wafer surface, the length (l) of each elongated output slot 334 shown in FIG. 7 must be greater than a radius of the semiconductor wafer W. In the embodiment 700 shown in FIG. 7, the length (l) of each elongated output slot 334 is substantially equal to one-half of the width (w) of the wafer support mechanism 320.

The embodiment 700 shown in FIG. 7 improves fluid flow uniformity across the entire semiconductor wafer W by coupling a pair of elongated nozzles 330 to the wafer support mechanism 320, where each nozzle supplies liquid to one-half of the wafer surface. Like the previous embodiment, the elongated nozzles 330 shown in FIG. 7 include a number of unique features, which redirect the fluid flow of the liquid supplied to the input port 332 and regulate the flow velocity of the liquid dispensed from the elongated output slot 334, such that the output flow velocity ($v_1 \ldots v_7$) is uniform (or substantially equal in velocity) across the direction ($d_\perp$) perpendicular to the direction of fluid flow. By utilizing two elongated nozzles 330 instead of one, the embodiments shown in FIGS. 3 and 7 improve fluid flow uniformity across the wafer surface by reducing pressure gradients and flow variations through the elongated nozzles 330.

In the embodiments shown in FIGS. 6-7, the wafer support mechanism 320 and elongated nozzle(s) 330 are arranged in a vertical orientation to facilitate use of such components within a batch processing system, such as the wet processing system 300 shown in FIG. 3. However, the techniques described herein are not strictly limited to batch processing. In some embodiments, the wafer support mechanism 320 and elongated nozzle(s) 330 may be arranged in a horizontal orientation, as shown in the embodiment 800 of FIG. 8, to facilitate use of such components within a single wafer processing system.

When oriented horizontally, the liquid (L) dispensed by the elongated nozzle(s) 330 flows in a horizontal direction ($d_h$) across the surface of the semiconductor wafer W before spilling over the top of the wafer support mechanism 320, as shown in FIG. 8. Like the previous embodiments shown in FIGS. 6-7, the elongated nozzles 330 shown in FIG. 8 include a number of unique features, which redirect the fluid flow of the liquid supplied to the input port 332 and regulate the flow velocity of the liquid dispensed from the elongated output slot 334, such that the output flow velocity is uniform (or substantially equal in velocity) across the direction ($d_\perp$) perpendicular to the direction of fluid flow (i.e., the horizontal direction, $d_h$).

FIGS. 9A-9F provide additional details for the elongated nozzle(s) 330 shown in FIGS. 3, 6, 7 and 8. As shown in FIGS. 9A-9D, the elongated nozzle 330 generally includes an input port 332 coupled to receive liquid from an attached liquid supply line 340, an elongated output slot 334 configured to dispense the liquid onto the planar surface 322 of the wafer support mechanism 320 with the uniform flow velocity, and a fluid flow path 336 which redirects the fluid flow of the liquid supplied to the input port 332 and regulates the flow velocity of the liquid dispensed from the elongated output slot 334 of the elongated nozzle 330. A shown in FIGS. 9A, 9B and 9D, the fluid flow path 336 includes a high conductance fluid flow path 335 coupled for receiving the liquid supplied to the input port 332 and a low conductance fluid flow path 337 coupled between the high conductance fluid flow path 335 and the elongated output slot 334 for regulating the flow velocity of the liquid. As used herein, the term "conductance" refers to how easily the liquid is conducted through the fluid flow path. The high conductance fluid flow path 335 conducts liquid easily with very little (or no) resistance to fluid flow. On the other hand, the low conductance fluid flow path 337 includes a pattern of fluid flow obstructions 338 that obstruct fluid flow, thereby reducing the conductance through the low conductance fluid flow path 337.

Figure 9A:
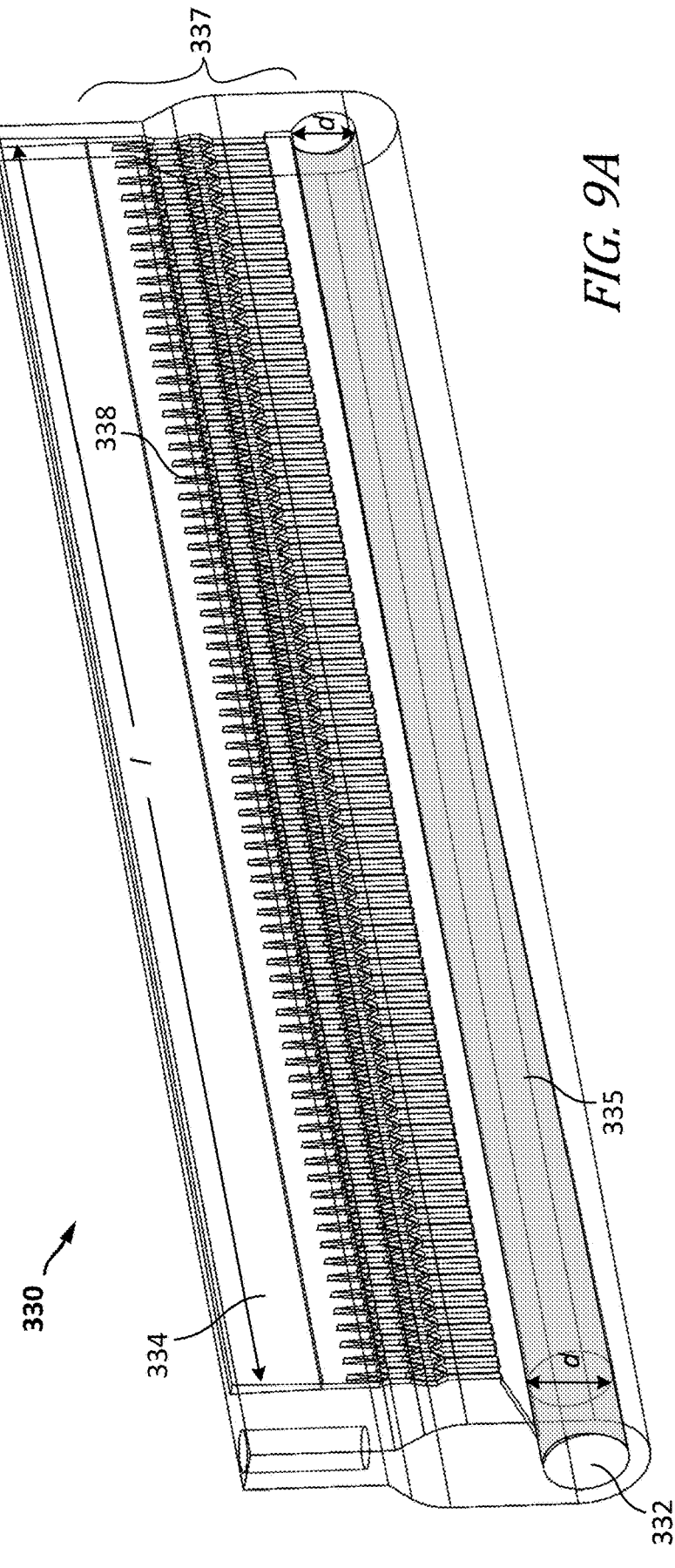
FIG. 9A is a 3D perspective, wire frame view of an elongated nozzle in accordance with one embodiment of the present disclosure.

The high conductance fluid flow path 335 is a tubular path, which guides the liquid supplied to the input port 332 of the elongated nozzle 330 to the low conductance fluid flow path 337. In some embodiments, the diameter (d) of the high conductance fluid flow path 335 may gradually taper or decrease along the length of the elongated nozzle 330 to gradually increase the fluid flow velocity of the liquid near the distal end of the elongated nozzle 330 (i.e., the end opposite the input port 332), as shown in FIGS. 9A and 9D.

Figure 9B:
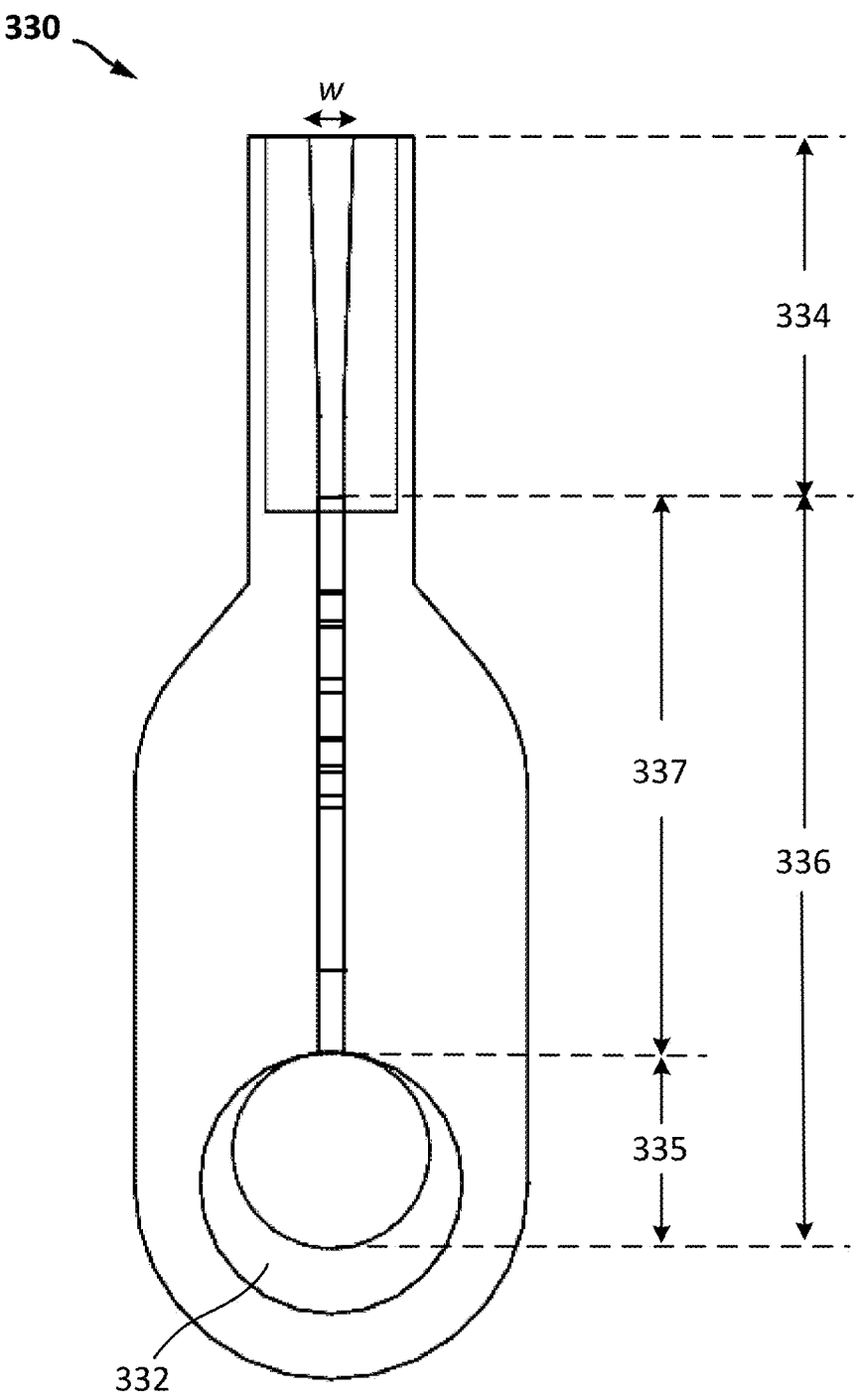
FIG. 9B is a side view of the elongated nozzle shown in FIG. 9A.
Figure 9C:
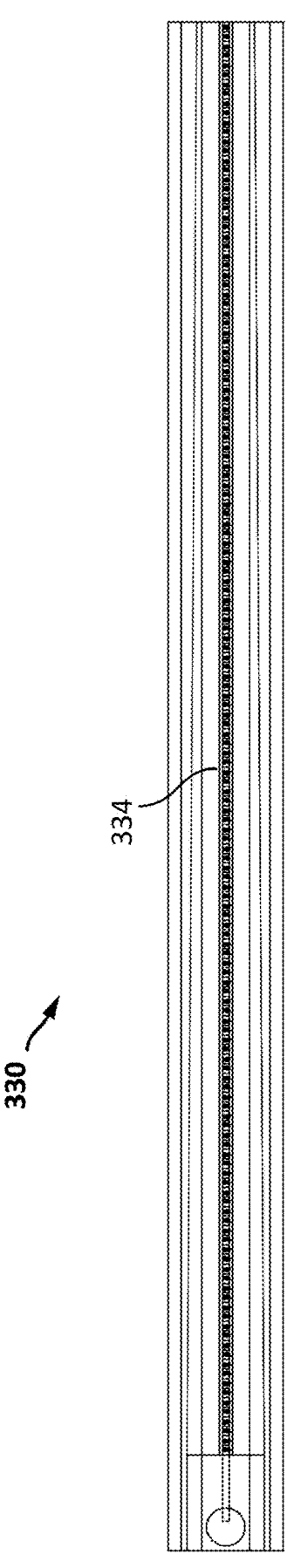
FIG. 9C is a top-down view of the elongated nozzle shown in FIG. 9A.

The low conductance fluid flow path 337 includes a pattern of fluid flow obstructions 338, which redirect the fluid flow approximately 90° and regulate the flow velocity of the liquid passing through the low conductance fluid flow path 337. Liquid passing through the low conductance fluid flow path 337 is output from the elongated output slot 334 with uniform flow velocity. In some embodiments, the length (l) of the elongated output slot 334 may be greater than or equal to the diameter of a semiconductor wafer W to provide uniform flow velocity across the entire wafer surface, as shown in FIG. 6. In other embodiments, the length (l) of the elongated output slot 334 may be greater than the radius (but less than the diameter) of a semiconductor wafer W to provide uniform flow velocity across one-half of the wafer surface, as shown in FIGS. 3 and 7. In some embodiments, the width (w) of the elongated output slot 334 may gradually expand to the size of the chamber channel (e.g., approximately 1-2 mm), as shown in FIG. 9B. In some embodiments (not shown), the elongated output slot 334 could be configured with an initial narrowing, creating a restriction in the output slot, to help balance out the exiting flows. The elongated output slot 334 could then expand to the size of the chamber channel (e.g., approximately 1-2 mm). In some embodiments, a final width (w) of the elongated output slot 334 may be approximately 2 mm to allow for 1 mm of exit flow on each side of the wafer (in a dual sided flow design).

Figure 9D:
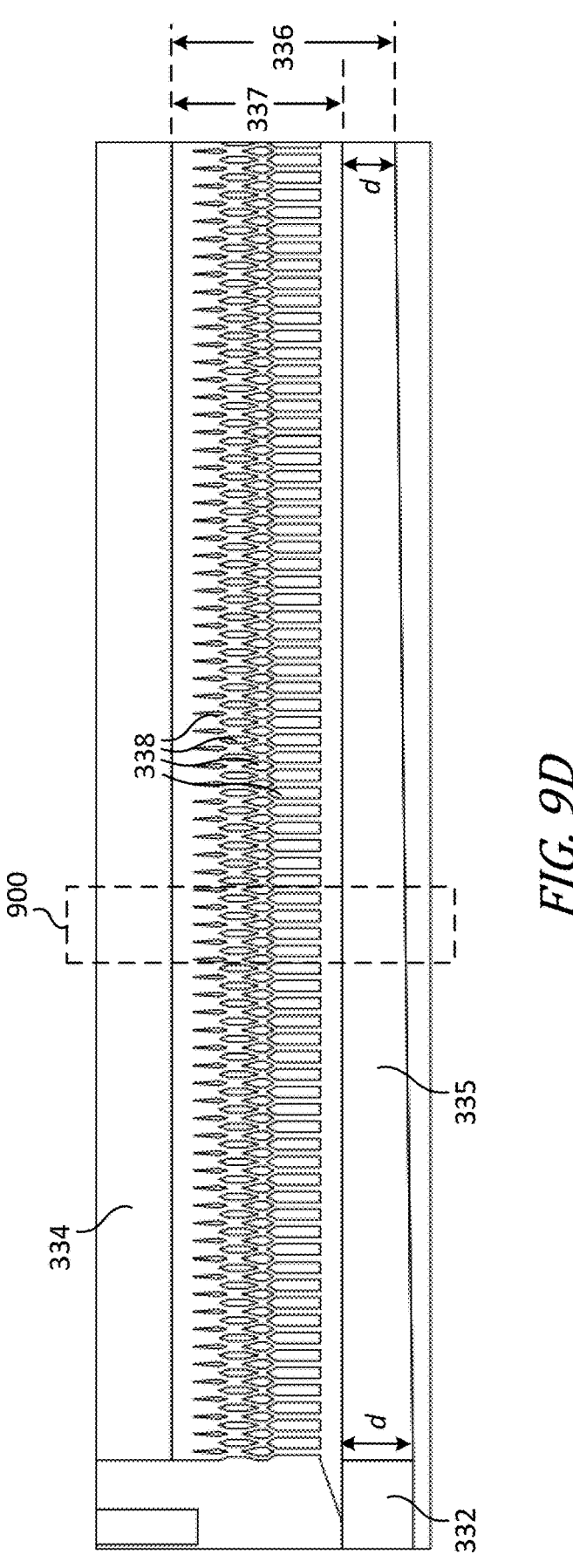
FIG. 9D is a cross-sectional view through the elongated nozzle shown in FIG. 9A.

FIGS. 9D-9F illustrate further details for the pattern of fluid flow obstructions 338 included within the low conductance fluid flow path 337. As shown in FIGS. 9D-9F, the pattern of fluid flow obstructions 338 includes a first set of fluid flow obstructions 912 and a second set of fluid flow obstructions 914. The first set of fluid flow obstructions 912 and the second set of fluid flow obstructions 914 are spaced close together to create narrow channels 916 there between. When liquid enters the low conductance fluid flow path 337, the narrow channels 916 formed between the first set of fluid flow obstructions 912 create high speed jets that help to distribute the fluid flow 917 uniformly across the length of the low conductance fluid flow path 337.

As shown in FIG. 9F, the fluid flow 917 passing through the narrow channels 916 is substantially faster near the center, and slower near the walls, of the narrow channels 916. This creates high speed jets (high speed flow) near the center, and eddies or dead zones (low speed flow) near the walls, of the narrow channels 916. The second set of fluid flow obstructions 914 redirects the fluid flow 917 toward rejoining channels 918, which combine the high speed flow in the center of the narrow channels 916 with the low speed flow along the channel walls to minimize the formation of eddies or dead zones within the narrow channels 916 and regulate the fluid flow velocity through the low conductance fluid flow path 337. In doing so, the low conductance fluid flow path 337 ensures that the liquid dispensed from the elongated output slot 334 is dispensed with uniform flow velocity across a direction perpendicular to the direction of fluid flow.

FIG. 10 illustrates one embodiment of a method 1000 that utilizes the techniques described herein to process a semiconductor wafer. In particular, FIG. 10 illustrates one embodiment of a method 1000 that utilizes the techniques described herein to improve a wet process performed on a semiconductor wafer. It will be recognized that the embodiment of FIG. 10 is merely exemplary and additional methods may utilize the techniques described herein. Further, additional processing steps may be added to the method shown in the FIG. 10 as the steps described are not intended to be exclusive. Moreover, the order of the steps is not limited to the order shown in the figures as different orders may occur and/or various steps may be performed in combination or at the same time.

The method 1000 shown in FIG. 10 begins by providing a semiconductor wafer within a wafer support mechanism having a planar surface with a recess configured to support the semiconductor wafer (in step 1010). As noted above and shown in FIGS. 4B and 5B, a surface of the semiconductor wafer is substantially flush with the planar surface of the wafer support mechanism when the semiconductor wafer is supported within the recess.

In step 1020, the method 1000 includes dispensing a first liquid onto the planar surface of the wafer support mechanism during a first duration of time, such that the first liquid flows in a lateral direction across the surface of the semiconductor wafer with uniform flow velocity across a direction perpendicular to the lateral direction.

In step 1030, the method 1000 includes dispensing a second liquid onto the planar surface of the wafer support mechanism during a second duration of time, which occurs after the first duration of time. Although the second liquid dispensed in step 1030 may differ from the first liquid dispensed in step 1020, the second liquid also flows in the lateral direction across the surface of the semiconductor wafer with uniform flow velocity across the direction perpendicular to the lateral direction. A liquid wavefront is generated when the second liquid is dispensed onto the planar surface of the wafer support mechanism during the second duration of time. The liquid waveform generated in step 1030 propagates across the planar surface of the wafer support mechanism and the surface of the semiconductor wafer to quickly exchange the first liquid with the second liquid. This minimizes mixing between the first and second liquids and ensures the time of exposure for each liquid is uniform across the semiconductor wafer.

In some embodiments, the first liquid and the second liquid may be dispensed from at least one elongated nozzle 330 in a pulsed sequence. As noted above and shown in FIGS. 9A-9F, the at least one elongated nozzle 330 may generally include: (a) a high conductance fluid flow path 335 coupled to receive the first/second liquid from a liquid supply line 340, (b) an elongated output slot 334 configured to dispense the first/second liquid onto the planar surface of the wafer support mechanism with uniform flow velocity, and (c) a low conductance fluid flow path 337, which is coupled between the high conductance fluid flow path 335 and the elongated output slot 334 for regulating the flow velocity of the first/second liquid dispensed by the elongated output slot 334. As further shown in FIGS. 9A-9F, the low conductance fluid flow path 337 may generally include a pattern of fluid flow obstructions, which regulate the flow velocity of the first/second liquid passing through the low conductance fluid flow path 337 to ensure that the first/second liquid is dispensed from the elongated output slot 334 with uniform flow velocity. In some embodiments, uniformity of flow velocity may be further improved by dispensing the first/second liquid from a pair of elongated nozzles, where each nozzle dispenses the first/second liquid across one-half of the semiconductor wafer.

Wet processing systems, liquid dispense nozzles and methods for processing a semiconductor substrate (or semiconductor wafer) are described in various embodiments. The substrate may include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems and methods described herein will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A wet processing system, comprising:
   a wafer support mechanism having a planar surface with a recess formed in the planar surface, wherein the recess is configured to support a semiconductor wafer, and wherein a surface of the semiconductor wafer is substantially flush with the planar surface of the wafer support mechanism when the semiconductor wafer is supported within the recess; and
   at least one elongated nozzle coupled to the wafer support mechanism, wherein the at least one elongated nozzle is configured to dispense a liquid onto the planar surface of the wafer support mechanism, wherein the liquid flows in a lateral direction across the surface of the semiconductor wafer with uniform flow velocity across a direction perpendicular to the lateral direction, and wherein the at least one elongated nozzle comprises:
      an elongated output slot configured to dispense the liquid onto the planar surface of the wafer support mechanism with the uniform flow velocity; and
      a pattern of fluid flow obstructions, which regulate a flow velocity of the liquid passing through the at least one elongated nozzle to ensure that the liquid is dispensed from the elongated output slot with the uniform flow velocity.

2. The wet processing system of claim 1, wherein the at least one elongated nozzle comprises a pair of elongated nozzles, each configured to dispense the liquid across one-half of the semiconductor wafer.

3. The wet processing system of claim 1, wherein the wafer support mechanism is a wafer tray, and wherein the liquid dispensed by the at least one elongated nozzle flows across the planar surface of the wafer tray and the surface of the semiconductor wafer supported within the recess of the wafer tray.

4. The wet processing system of claim 1, wherein the wafer support mechanism is a wafer chamber implemented as an open-ended box having a plurality of sides, and wherein the plurality of sides comprise:

a back side comprising the planar surface with the recess for supporting the semiconductor wafer;

a front side arranged opposite the back side; and a pair of opposing side surfaces that connect the front side to the back side to form a channel between the front side and the back side;

wherein the liquid dispensed by the at least one elongated nozzle flows through the channel from one open end of the channel, across the surface of the semiconductor wafer, to an opposite open end of the channel.

5. The wet processing system of claim 1, wherein the wafer support mechanism and the at least one elongated nozzle are arranged in a vertical orientation, and wherein the liquid dispensed by the at least one elongated nozzle flows in a vertical direction across the surface of the semiconductor wafer.

6. The wet processing system of claim 5, wherein the wet processing system is a batch processing system configured for simultaneously processing a plurality of semiconductor wafers at a time, the batch processing system comprising:

a plurality of wafer support mechanisms, each having a planar surface with a recess configured to support a different one of the plurality of semiconductor wafers; and a plurality of elongated nozzles coupled to the plurality of wafer support mechanisms, wherein each of the plurality of elongated nozzles is configured to dispense a liquid that flows in the vertical direction across a surface of a given semiconductor wafer with uniform flow velocity across a direction perpendicular to the vertical direction.

7. The wet processing system of claim 6, wherein the plurality of wafer support mechanisms isolate the plurality of semiconductor wafers from one another to avoid transferring contamination from one semiconductor wafer to another semiconductor wafer.

8. The wet processing system of claim 1, wherein the wafer support mechanism and the at least one elongated nozzle are arranged in a horizontal orientation, and wherein the liquid dispensed by the at least one elongated nozzle flows in a horizontal direction across the surface of the semiconductor wafer.

9. The wet processing system of claim 8, wherein the wet processing system is a single wafer processing system configured for processing only one semiconductor wafer at a time.

10. The wet processing system of claim 1, wherein a length of the elongated output slot is greater than or equal to a diameter of the semiconductor wafer, and wherein the liquid dispensed from the elongated output slot flows laterally across the entire semiconductor wafer.

11. The wet processing system of claim 1, wherein a length of the elongated output slot is greater than a radius, but less than a diameter, of the semiconductor wafer, and wherein the liquid dispensed from the elongated output slot flows laterally across one-half of the semiconductor wafer.

12. The wet processing system of claim 1, further comprising:

a liquid supply system comprising:

a plurality of liquid reservoirs containing a plurality of liquids used to process the semiconductor wafer; and a manifold coupled between the plurality of liquid reservoirs and a liquid supply line for selectively supplying one of the plurality of liquids to the liquid supply line at a time; and a controller coupled to the liquid supply system for controlling which of the plurality of liquids is selectively supplied to the liquid supply line for a predetermined duration of time.

13. The wet processing system of claim 12, wherein the controller is configured to control the liquid supply system to selectively supply to the liquid supply line:

a first liquid of the plurality of liquids during a first duration of time; and a second liquid of the plurality of liquids during a second duration of time, wherein the second liquid differs from the first liquid, and wherein the second duration of time occurs after the first duration of time.

14. The wet processing system of claim 13, wherein selectively suppling the second liquid to the liquid supply line generates a liquid wavefront, which propagates through the at least one elongated nozzle and across the planar surface of the wafer support mechanism and the surface of the semiconductor wafer to exchange the first liquid with the second liquid.

15. A wet processing system, comprising:

a wafer support mechanism having a planar surface with a recess configured to support a semiconductor wafer, wherein a surface of the semiconductor wafer is substantially flush with the planar surface of the wafer support mechanism when the semiconductor wafer is supported with the recess; and at least one elongated nozzle coupled to the wafer support mechanism, wherein the at least one elongated nozzle is configured to dispense a liquid onto the planar surface of the wafer support mechanism, wherein the liquid flows in a lateral direction across the surface of the semiconductor wafer with uniform flow velocity across a direction perpendicular to the lateral direction, and wherein the at least one elongated nozzle comprises:

a high conductance fluid flow path coupled to receive the liquid from a liquid supply line;

an elongated output slot configured to dispense the liquid onto the planar surface of the wafer support mechanism with the uniform flow velocity; and a low conductance fluid flow path coupled between the high conductance fluid flow path and the elongated output slot, wherein the low conductance fluid flow path comprises a pattern of fluid flow obstructions, which regulate a flow velocity of the liquid passing through the low conductance fluid flow path to ensure that the liquid is dispensed from the elongated output slot with the uniform flow velocity.

16. The wet processing system of claim 15, wherein a length of the elongated output slot is greater than or equal to a diameter of the semiconductor wafer, and wherein the liquid dispensed from the elongated output slot flows laterally across the entire semiconductor wafer.

17. The wet processing system of claim 15, wherein a length of the elongated output slot is greater than a radius, but less than a diameter, of the semiconductor wafer, and wherein the liquid dispensed from the elongated output slot flows laterally across one-half of the semiconductor wafer.

18. The wet processing system of claim 17, wherein the at least one elongated nozzle comprises a pair of elongated nozzles, each configured to dispense the liquid across one-half of the semiconductor wafer.

19. The wet processing system of claim 15, further comprising:

a liquid supply system comprising:

a plurality of liquid reservoirs containing a plurality of liquids used to process the semiconductor wafer; and a manifold coupled between the plurality of liquid reservoirs and the liquid supply line for selectively supplying one of the plurality of liquids to the liquid supply line at a time; and

a controller coupled to the liquid supply system for controlling which of the plurality of liquids is selectively supplied to the liquid supply line for a predetermined duration of time.

20. The wet processing system of claim 19, wherein the controller is configured to control the liquid supply system to selectively supply to the liquid supply line:

a first liquid of the plurality of liquids during a first duration of time; and a second liquid of the plurality of liquids during a second duration of time, wherein the second liquid differs from the first liquid, and wherein the second duration of time occurs after the first duration of time.

21. The wet processing system of claim 20, wherein selectively suppling the second liquid to the liquid supply line generates a liquid wavefront, which propagates through the at least one elongated nozzle and across the planar surface of the wafer support mechanism and the surface of the semiconductor wafer to exchange the first liquid with the second liquid.

* * * * *